(12) United States Patent
Nagashima et al.

(10) Patent No.: US 10,051,247 B2
(45) Date of Patent: Aug. 14, 2018

(54) IMAGE PROJECTION APPARATUS

(71) Applicant: Funai Electric Co., Ltd., Osaka (JP)

(72) Inventors: Kenji Nagashima, Takatsuki (JP);
Toyoshi Nogami, Higashiosaka (JP);
Tatsuya Ito, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 252 days.

(21) Appl. No.: 14/846,087

(22) Filed: Sep. 4, 2015

(65) Prior Publication Data
US 2016/0073071 A1     Mar. 10, 2016

(30) Foreign Application Priority Data

Sep. 5, 2014  (JP) ................................. 2014-181673
Sep. 5, 2014  (JP) ................................. 2014-181712

(51) Int. Cl.
*H04N 9/31*     (2006.01)
*G02B 27/01*    (2006.01)
(Continued)

(52) U.S. Cl.
CPC ............. *H04N 9/3155* (2013.01); *G02B 5/18* (2013.01); *G02B 26/10* (2013.01); *G02B 27/01* (2013.01);
(Continued)

(58) Field of Classification Search
CPC .. H04N 9/3111; H04N 9/3155; H04N 9/3164; H04N 9/3161; H04N 9/3123;
(Continued)

(56) References Cited

U.S. PATENT DOCUMENTS

2008/0055493 A1*  3/2008  Hanano .............. G02B 27/1033
                                                      349/9
2008/0253418 A1   10/2008  Egawa et al.
(Continued)

FOREIGN PATENT DOCUMENTS

WO        2012104967 A1      8/2012

OTHER PUBLICATIONS

European Search Report issued in corresponding European Patent Application 15183967.7 dated Feb. 8, 2016 (12 pages).
(Continued)

*Primary Examiner* — Christina Riddle
*Assistant Examiner* — Christopher Lamb, II
(74) *Attorney, Agent, or Firm* — Osha Liang LLP

(57) ABSTRACT

An image projection apparatus includes laser light sources that each emit laser light; a beam combiner combining the laser lights; a beam deflector periodically changing a traveling direction of the combined laser lights and directing the laser lights to a screen; and a controller controlling a drive current supplied to the laser light sources based on a relationship between the drive current and a total light intensity outputted from the laser light sources, in which the total light intensity comprises three ranges, the controller supplies the drive current to the laser light sources when the laser lights are emitted in the total light intensity included in either the first or the third range, and the controller supplies the drive current to at least one or some of the laser light sources when the combined laser lights are emitted in the total light intensity included in the second range.

20 Claims, 23 Drawing Sheets

(51) Int. Cl.
*G09G 3/20* (2006.01)
*G02B 5/18* (2006.01)
*G02B 26/10* (2006.01)
*H01S 5/40* (2006.01)
*G09G 3/00* (2006.01)
G02B 27/30 (2006.01)
H01S 5/00 (2006.01)
H01S 5/06 (2006.01)
H01S 5/062 (2006.01)

(52) U.S. Cl.
CPC ......... *G02B 27/0101* (2013.01); *G09G 3/002* (2013.01); *G09G 3/2003* (2013.01); *H01S 5/4012* (2013.01); *H04N 9/3135* (2013.01); *H04N 9/3161* (2013.01); *H04N 9/3164* (2013.01); *G02B 27/30* (2013.01); *G02B 2027/014* (2013.01); *G02B 2027/0112* (2013.01); *G02B 2027/0118* (2013.01); *G09G 2310/08* (2013.01); *H01S 5/005* (2013.01); *H01S 5/0617* (2013.01); *H01S 5/06216* (2013.01)

(58) Field of Classification Search
CPC .............. H04N 9/3129; G02B 27/0101; G02B 27/01–27/0198; G03B 21/2013; G03B 21/2033; G03B 21/2053; G09G 3/02; H01S 5/065–5/0658
See application file for complete search history.

(56) References Cited

U.S. PATENT DOCUMENTS

| | | | |
|---|---|---|---|
| 2011/0211240 A1* | 9/2011 | Takeda | G09G 3/02 359/197.1 |
| 2012/0133901 A1* | 5/2012 | Miura | G03B 21/2013 353/31 |
| 2012/0169777 A1 | 7/2012 | Budni et al. | |
| 2012/0242960 A1* | 9/2012 | Oiwa | G02B 27/48 353/31 |
| 2012/0249621 A1* | 10/2012 | Miura | G02B 3/0056 345/694 |
| 2013/0050593 A1* | 2/2013 | Fujikawa | G02B 27/283 349/9 |
| 2014/0240611 A1* | 8/2014 | Kimura | G02B 27/48 348/750 |

OTHER PUBLICATIONS

Office Action in counterpart Chinese Patent Application No. 201510559755.X dated Aug. 3, 2017 (14 pages).

* cited by examiner

FIG. 4

| Light intensity | Current amount | Supply destination | |
|---|---|---|---|
| | | LD111 | LD112 |
| 0<br>⋮<br>Pb | 0<br>⋮<br>Ib1+Ib2 | YES | YES |
| Pb<br>⋮<br>Pa | Ib<br>⋮<br>Ia | NO | YES |
| Pa<br>⋮<br>Po | Ia1+Ia2<br>⋮<br>Io1+Io2 | YES | YES |

Management range: {Pb...Pa, Ib...Ia}

FIG. 6(a)   I-L properties of LD 111
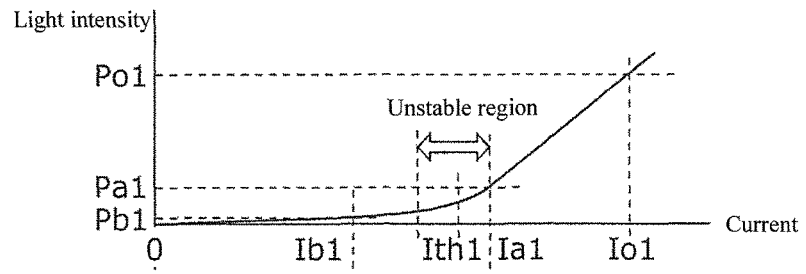
FIG. 6(b)   I-L properties of LD 112
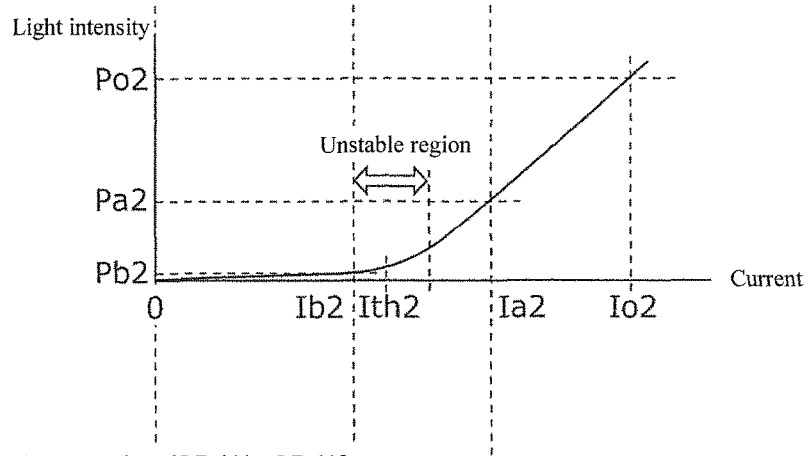
FIG. 6(c)   I-L properties of LD 111 + LD 112
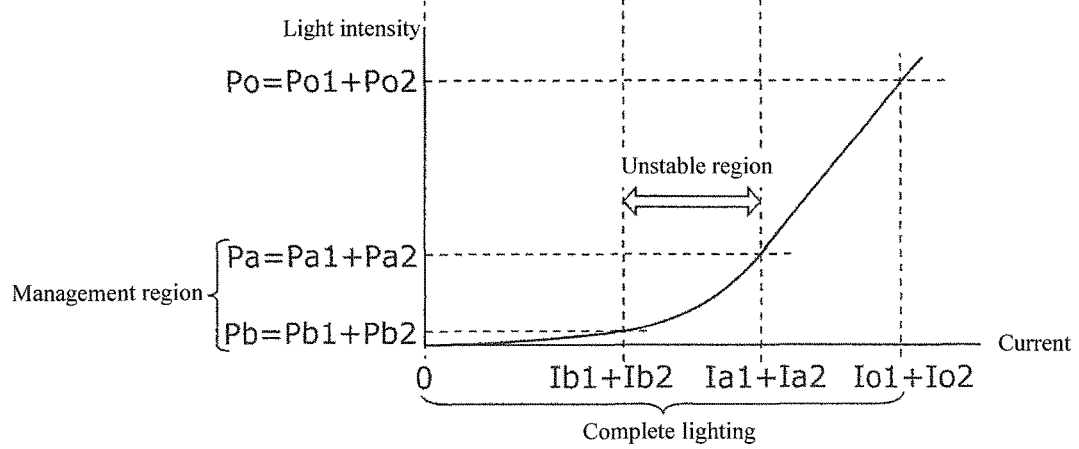

FIG. 7(a)  I-L properties of LD 111
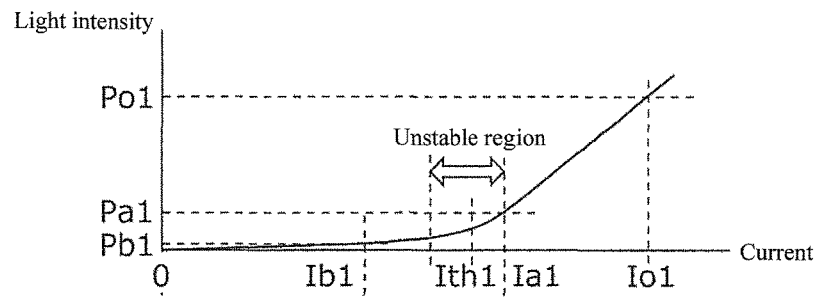
FIG. 7(b)  I-L properties of LD 112
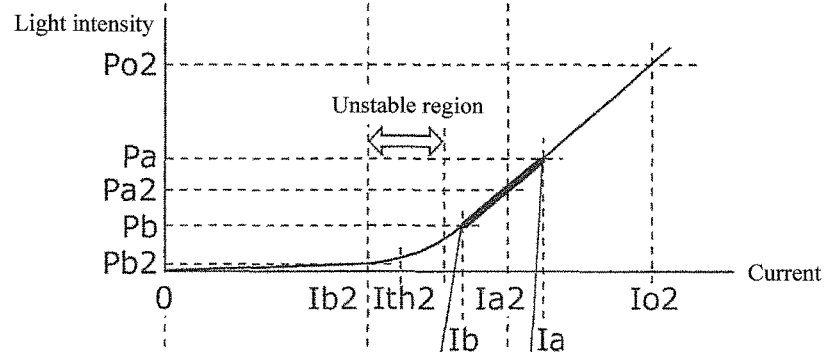
FIG. 7(c)  I-L properties of LD 111 + LD 112
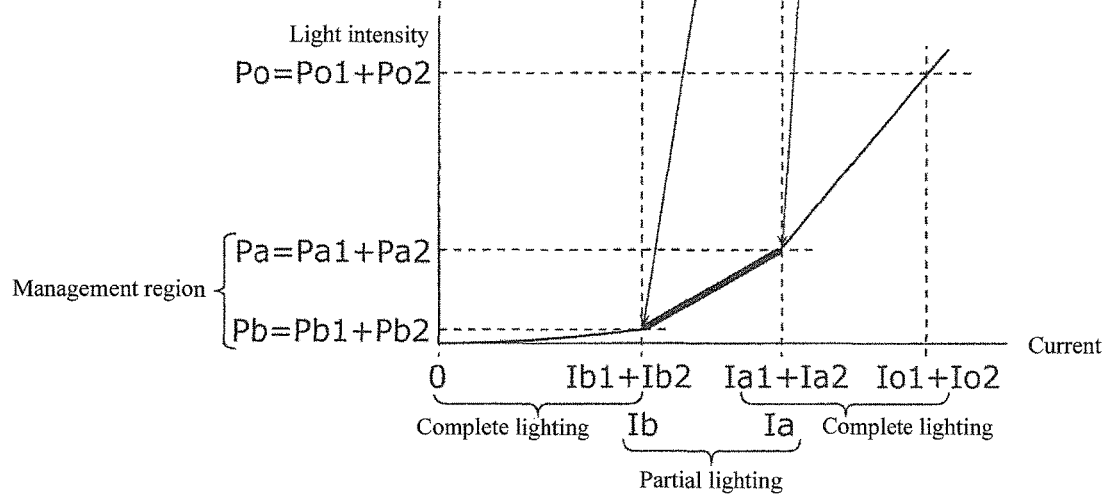

IMAGE PROJECTION APPARATUS

TECHNICAL FIELD

The present invention relates generally to an image projection apparatus, and more particularly relates to an image projection apparatus that uses a laser-emitting element as a light source.

BACKGROUND ART

Image projection apparatuses having a laser-emitting element as a light source are used as laser projectors, automotive HUDs (head-up displays), and the like. Such image projection apparatuses comprise, for example, a laser-emitting element that emits a red light, a laser-emitting element that emits a green light, and a laser-emitting element that emits a blue light and project a color image to a screen by guiding each light emitted from these laser-emitting elements to the screen.

One property of the image projection apparatuses is the wide brightness range (also referred to as wide dynamic range) of the image, which may result in stable projection. For example, when an image projection apparatus is used in an automotive HUD, if the dynamic range is wide, an image can be displayed at a brightness suited for a driver to view under any condition, for example, a condition where the intensity of an external light differs from a clear day to the night.

In a conventional laser-emitting element, a minimum drive current (a so-called threshold current) is necessary to stably perform laser oscillation. When a drive current at or above this threshold is supplied, the laser-emitting element stably emits a laser light having an intensity in accordance with an amount of the drive current. Meanwhile, when a current less than the threshold is supplied, the laser light cannot be stably emitted.

Therefore, a technology is known that performs pulse emission of the laser-emitting element by a drive current that has an amplitude at or above the threshold and whose pulse width is modulated (for example, Patent Literature 1). According to this technology, a laser light whose effective intensity is small compared to a situation in which the laser-emitting element continuously emits can be stably obtained.

CITATION LIST

Patent Literature

[Patent Literature 1] WO 2012/104967

SUMMARY OF THE INVENTION

However, causing the laser-emitting element to perform pulse emission to generate the drive current whose pulse width is modulated requires a switching circuit that chops a comparatively large current by a high frequency of at least a pixel frequency or greater, which results in a more complicated circuit.

Furthermore, because the drive current is a pulse current of a high frequency, constraints in implementation are likely to arise—for example, providing a supply route of the drive current to be extremely short to reduce waveform distortion and suppress electromagnetic noise.

An image projection apparatus according to one or more embodiments of the invention uses a laser-emitting element as a light source and can stably project an image without modulating a pulse width of a drive current of the laser-emitting element and in a wide brightness range.

An image projection apparatus according to one or more embodiments of the invention comprises: a laser light source that has a plurality of emission points that emits a plurality of first laser lights of a wavelength belonging to one color and a beam shaper that combines the plurality of first laser lights into one second laser light; a beam deflector that periodically changes a traveling direction of the second laser light; a driver that supplies a variable drive current to one or more emission points selected from the plurality of emission points; and a controller that controls the driver according to a target intensity of the second laser and switches between supplying one drive current to a portion of the plurality of emission points and distributing the one drive current to every emission point according to whether the target intensity is included in a management range, which is a range of an intensity of the second laser light obtained when the one drive current is distributed to every emission point and one or more emission points operate in a predetermined unstable region that includes a mode competition region.

According to one or more embodiments of the invention, a laser light having an intensity in the second range (the management range) in which there is a concern that the light intensity will become unstable when the laser light is generated by all of the plurality of laser light sources, is generated by at least one or some of the plurality of laser light sources. Because the laser light having the intensity in the second range is generated by a fewer number of the laser light sources, a light intensity generated by each laser light source becomes greater. As a result, it can be avoided for the laser light sources to operate in the unstable region, and it mitigates the concern that the light intensity becomes unstable.

Furthermore, the controller may supply a drive current of an amount corresponding to the target intensity to a supply destination corresponding to the target intensity by holding correspondence information that, for each of the plurality of intensities included in the management range, indicates as an amount of the drive current a current amount where the intensity can be obtained by supplying to the portion of the plurality of emission points and indicates the portion of the plurality of emission points as the supply destination of the drive current and, for each of a plurality of intensities not included in the management range, indicates as the amount of the drive current a current amount where the intensity can be obtained by distributing to all of the plurality of emission points and indicates all of the plurality of emission points as the supply destination of the drive current and by controlling the driver according to the correspondence information.

According to one or more embodiments of the invention, the controller controls the driver according to the correspondence information; therefore, the above effects can be obtained.

Furthermore, each of the plurality of emission points has an individual threshold that is a minimum value of an operation current necessary to start laser oscillation, and the unstable region of each of the plurality of emission points may be defined by a current range established in advance around the threshold of the emission point.

According to one or more embodiments of the invention, the driver is controlled based on the threshold; therefore, the above effects can be obtained.

Furthermore, when the target intensity is included in the management range, the controller may supply the drive current to one emission point whose threshold is the smallest from among the plurality of emission points by controlling the driver.

According to one or more embodiments of the invention, the laser light having the intensity in the second range is likely to be generated with a smaller drive current, and this is advantageous in terms of power saving for the image projection apparatus.

Furthermore, each of the plurality of emission points may be provided in different laser-emitting elements, and the beam shaper may be configured by a beam combiner that combines the plurality of first laser lights into the second laser light and a collimator lens that converts the second laser light into a substantially parallel light.

According to one or more embodiments of the invention, the laser light source can be configured by the emission point, the beam combiner, and the collimator lens.

Furthermore, each of the plurality of emission points may be provided in a single laser-emitting element, and the beam shaper may be configured by a collimator lens that converts each of the plurality of first laser lights into a substantially parallel light and a diffraction grid plate that receives each of the plurality of first laser lights after being converted into the substantially parallel light at a different region and diffracts the lights in substantially identical traveling directions.

Furthermore, each of the plurality of emission points may be provided in a single laser-emitting element, the beam shaper may be configured by a diffraction grid plate that receives each of the plurality of first laser lights at a different region and diffracts the lights in different traveling directions and a collimator lens that converts each of the plurality of first laser lights after diffraction into a substantially parallel light, and the diffraction grid plate may diffract the plurality of first laser lights in an orientation where emission can be deemed as being from one point on an optical axis of the collimator lens.

According to one or more embodiments of the invention, the laser light source can be configured by the emission point, the collimator lens, and the diffraction grid plate.

Furthermore, the laser light source may be provided in correspondence with each of a plurality of colors, the image projection apparatus may further comprise a beam combiner that combines the second laser lights of each color into a single third laser light, the beam deflector may periodically change a traveling direction of the third laser light, the driver may supply for each color a variable drive current to one or more emission points selected from the plurality of emission points included in the laser light source corresponding to the color, and the controller may, for each color, switch between supplying a drive current of an amount corresponding to the target intensity of the second laser light of the color to a portion of the plurality of emission points corresponding to the color and distributing the drive current to all of the plurality of emission points.

According to one or more embodiments of the invention, a color image projection apparatus is obtained.

The invention can not only be realized as such an image projection apparatus but also as a control method of an image projection apparatus including steps executed in such an image projection apparatus. Moreover, such a control method can also be realized as a program to be executed by a computer.

An image projection apparatus according to one or more embodiments of the invention comprises: a plurality of laser light sources that each emits laser light; a first beam combiner that combines the laser lights; a beam deflector that periodically changes a traveling direction of the combined laser lights and directs the combined laser lights to a screen; and a controller that controls a drive current supplied to each of the laser light sources based on a relationship between the drive current and a total light intensity outputted from the laser light sources, wherein the total light intensity comprises a first, a second, and a third range, the controller supplies the drive current to each of the laser light sources when the combined laser lights are emitted in the total light intensity included in either the first range or the third range, and the controller supplies the drive current to at least one or some of the laser light sources when the combined laser lights are emitted in the total light intensity included in the second range.

A head-up display device according to one or more embodiments of the invention comprises: an image projection apparatus; and a screen, wherein the image projection apparatus comprises: a plurality of laser light sources that each emits laser light; a first beam combiner that combines the laser lights; a beam deflector that periodically changes a traveling direction of the combined laser lights and directs the combined laser lights to a screen; and a controller that controls a drive current supplied to each of the laser light sources based on a relationship between the drive current and a total light intensity outputted from the laser light sources, wherein the total light intensity comprises a first, a second, and a third range, the controller supplies the drive current to each of the laser light sources when the combined laser lights are emitted in the total light intensity included in either the first range or the third range, and the controller supplies the drive current to at least one or some of the laser light sources when the combined laser lights are emitted in the total light intensity included in the second range.

An image projection method according to one or more embodiments of the invention comprises: emitting laser lights from a plurality of laser light sources; combining the laser lights; periodically changing a traveling direction of the combined laser lights and directing the combined laser lights to a screen; and controlling a drive current supplied to each of the laser light sources based on a relationship between the drive current and a total light intensity outputted from the laser light sources, wherein the total light intensity comprises a first, a second, and a third range, and the controlling comprises supplying the drive current to each of the laser light sources when the combined laser lights are emitted in the total light intensity included in either the first range or the third range, and supplying the drive current to at least one or some of the laser light sources when the combined laser lights are emitted in the total light intensity included in the second range.

According to one or more embodiments of the invention, an image projection apparatus is provided that uses a laser-emitting element as a light source and can stably project an image without modulating a pulse width of a drive current of the laser-emitting element and in a wide brightness range.

BRIEF DESCRIPTION OF DRAWINGS

FIG. 4 shows a diagram illustrating an example of correspondence information according to one or more embodiments of the invention.

FIGS. 6(a), 6(b), and 6(c) shows graphs describing an example of a control method of the image projection apparatus according to one or more embodiments of the invention.

FIGS. 7(a), 7(b), and 7(c) shows graphs describing an example of a control method of the image projection apparatus according to one or more embodiments of the invention.

DESCRIPTION OF EMBODIMENTS

As described in the Background section, causing a laser-emitting element to emit by pulse-width modulation may result in an overly complicated circuit with constraints in implementation. One or more embodiments of the invention obtain an intense laser light whose dynamic range is wide while causing the laser-emitting element to continuously emit.

In this consideration, the present inventors first confirmed emission properties of the laser-emitting element.

Figure 13:
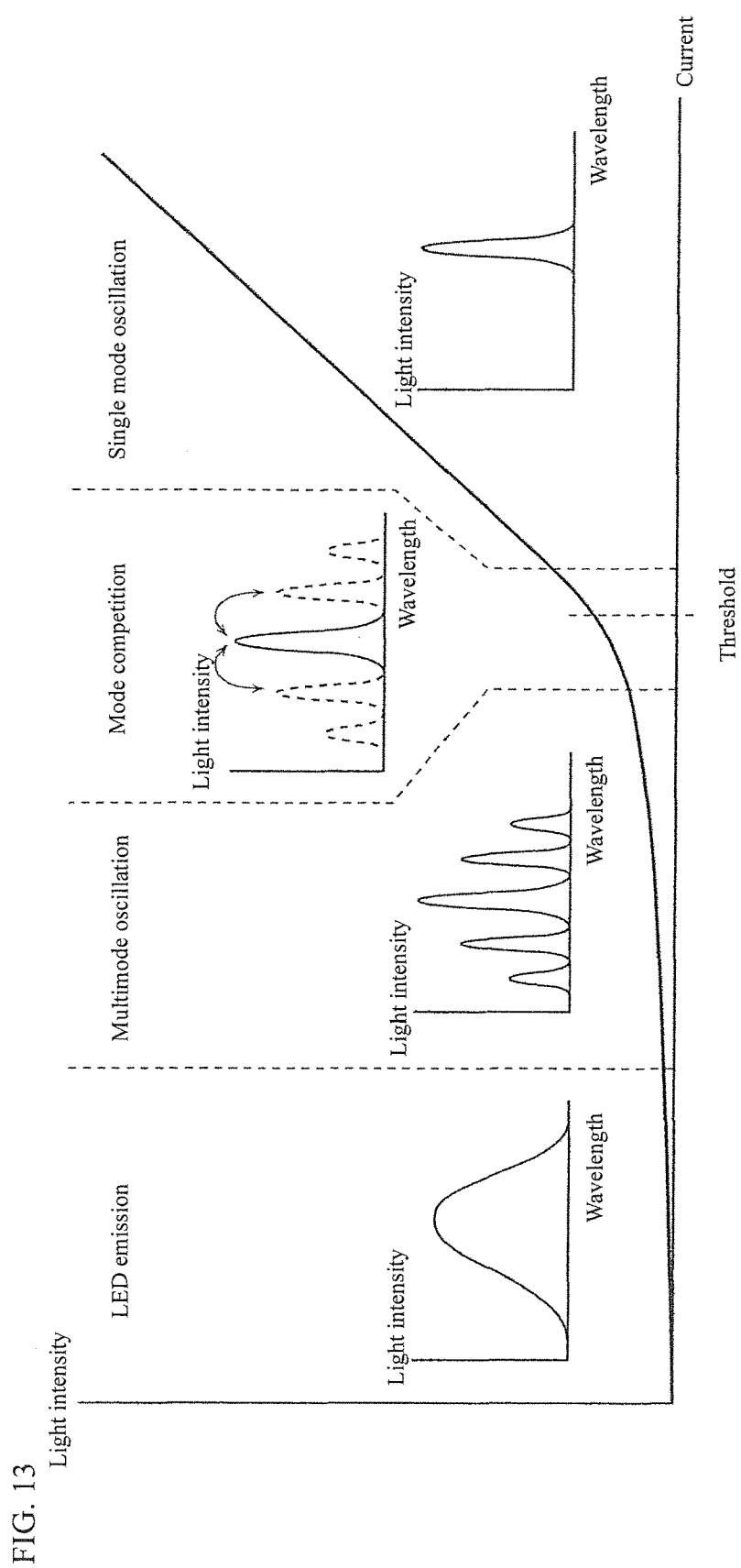
FIG. 13 shows a graph illustrating an example of typical emission properties of a laser diode.

FIG. 13 is a graph illustrating an example of typical emission properties of a laser diode as an example of the laser-emitting element. Illustrated in FIG. 13 are operation modes of the laser diode and light intensities obtained from the laser diode in correspondence with various drive currents of the laser diode.

As illustrated in FIG. 13, in an LED (light-emitting diode) emission region wherein a drive current is small, the laser diode, similarly to a light-emitting diode, emits a light beam by spontaneous emission. The light beam obtained in the LED emission region has a stable intensity that corresponds well with the drive current despite being incoherent, having a wide spectrum, and having a small intensity.

In a multimode oscillation region wherein a drive current is greater, the laser diode generates laser oscillation simultaneously in a large number of oscillation modes corresponding to different wavelengths. A laser light obtained in the multimode oscillation region has intensity peaks at a plurality of wavelengths. The laser light has as a sum total of the light intensities of the wavelengths a stable intensity that corresponds well with the drive current.

In a mode competition region wherein a drive current is still greater, the laser diode generates laser oscillation while hopping at high speed one of the plurality of oscillation modes corresponding to different wavelengths. With a laser light obtained in the mode competition region, an intensity peak interchanges at high speed with a wavelength corresponding to an oscillation mode performing laser oscillation. Because of this, the intensity of the laser light, while corresponding to the drive current in a time average, fluctuates instantaneously in a range according to the drive current. A threshold of the laser diode is included in the mode competition region.

In a single mode oscillation region where the drive current is further greater, the laser diode generates laser oscillation in a single oscillation mode. A laser light obtained in the single mode oscillation region has an intensity peak in a coherent and single wavelength and has a stable intensity that corresponds well with the drive current.

Based on such emission properties, conventionally, it is common to operate the laser diode in single mode oscillation. A conventional technology of causing the laser diode to emit by a drive current that has an amplitude no less than the threshold and whose pulse width is modulated to obtain a laser light whose effective intensity is small is also based on this conceptualization.

In contrast, the present inventors noticed that in uses where an incoherency of a laser light and some spreading of a spectrum is permitted, as in, for example, an image projection apparatus, it is favorable to cause the laser diode to continuously emit using not only the single mode oscillation region but also the multimode oscillation region and the LED emission region. However, in this situation, the laser diode operating in the mode competition region needs to be avoided. This is because as above, there are temporal fluctuations in the intensity of the laser light obtained in the mode competition region and when a screen is scanned with the laser light there is a concern that brightness unevenness and color unevenness will arise in the projected image.

However, a laser light of an intensity range corresponding to the mode competition region cannot be obtained by simply avoiding the mode competition region.

As a result of intensive study based on such findings, the present inventors arrived at an image projection apparatus according to one or more embodiments of the invention.

Embodiments of the invention will be described in detail below using the drawings. Each embodiment that will be described below illustrates a detailed example of the invention. Numerical values, shapes, materials, components, disposition and connection modes of the components, and the like are but examples and are not intended to limit the invention.

Example 1

An image projection apparatus according to one or more embodiments generates a laser light whose intensity is modulated by pixel by a laser light source and projects an image to a screen by scanning the screen with the laser light.

A plurality of emission points is provided in the laser light source, and the image projection apparatus, when attempting to obtain a laser light of a target intensity, switches between supplying one drive current to a portion of the emission points or distributing the one drive current to every emission point according to whether the target intensity is included in a management range. The management range is defined as a range of the intensity of the laser light obtained when the one drive current is distributed to every emission point and one or more emission points operate in a predetermined unstable region including the mode competition region.

Figure 1:
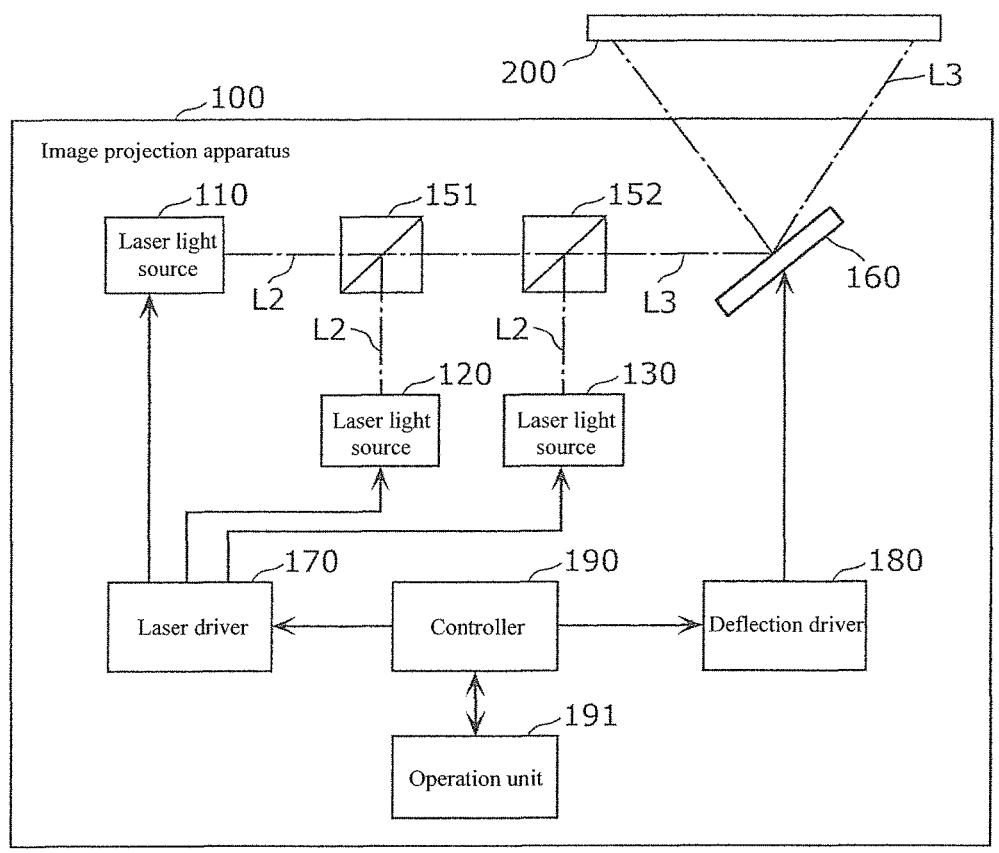
FIG. 1 shows a block diagram illustrating an example of a functional configuration of an image projection apparatus according to one or more embodiments of the invention.

FIG. 1 is a block diagram illustrating an example of a functional configuration of an image projection apparatus according to one or more embodiments of the invention. As illustrated in FIG. 1, an image projection apparatus 100 comprises laser light sources 110, 120, 130; beam combiners 151, 152 (first beam combiners); a beam deflector 160; a laser driver 170; a deflection driver 180; a controller 190; and an operation unit 191. In FIG. 1, together with the image projection apparatus 100, a screen 200 onto which the image is projected is illustrated.

The laser light sources 110, 120, 130 are provided correspondingly respectively to, for example, red, green, and blue and are laser light sources that emit a plurality of first laser lights belonging to the corresponding one color by combining them into one second laser light L2. Details of the laser light sources 110, 120, 130 will be described below.

The beam combiners 151, 152 combine the second laser lights L2 of each color emitted respectively from the laser light sources 110, 120, 130 into one third laser light L3. The beam combiners 151, 152 may comprise, for example, a dichroic prism.

The beam deflector 160 periodically changes a traveling direction of the third laser light L3 that combines the second laser lights L2. The beam deflector 160 deflects the third laser light L3 toward the screen 200 to scan the screen 200. The beam deflector 160 may comprise, for example, a biaxial movable mirror and an actuator that moves the mirror.

The laser driver 170 supplies a drive current to the laser light sources 110, 120, 130 based on a control by the controller 190. Details of the laser driver 170 will be described below.

The deflection driver 180 controls an orientation of the beam deflector 160 based on a control by the controller 190.

The controller 190 generates the laser light whose intensity is modulated by pixel by controlling the laser driver 170 and the deflection driver 180 and projects a desired image to the screen 200 by scanning the screen 200 with the laser light. The controller 190 may, for example, project to the screen 200 each frame of a video represented by a video signal (not illustrated) supplied from outside of the image projection apparatus 100.

The controller 190 may comprise, for example, a one-chip microcomputer having an MPU (micro processing unit), a RAM (random-access memory), a ROM (read-only memory), an I/O (input/output) port, and the like. A control function of the controller 190 may be a software function fulfilled by the MPU executing a program stored in the ROM by using the RAM as a working memory.

The operation unit 191 is a unit that accepts an operation by a user for indicating an operation of the image projection apparatus 100. Indications that the operation unit 191 accepts from the user can include an indication such as turning a power source of the image projection apparatus 100 on and off. The operation unit 191 may comprise a mechanical switch or a touch panel provided in a housing of the image projection apparatus 100 and may comprise a remote control interface that receives a signal sent from a remote controller separate from the image projection apparatus 100.

Next, a configuration of the laser light sources 110, 120, 130 will be described.

Figure 2:
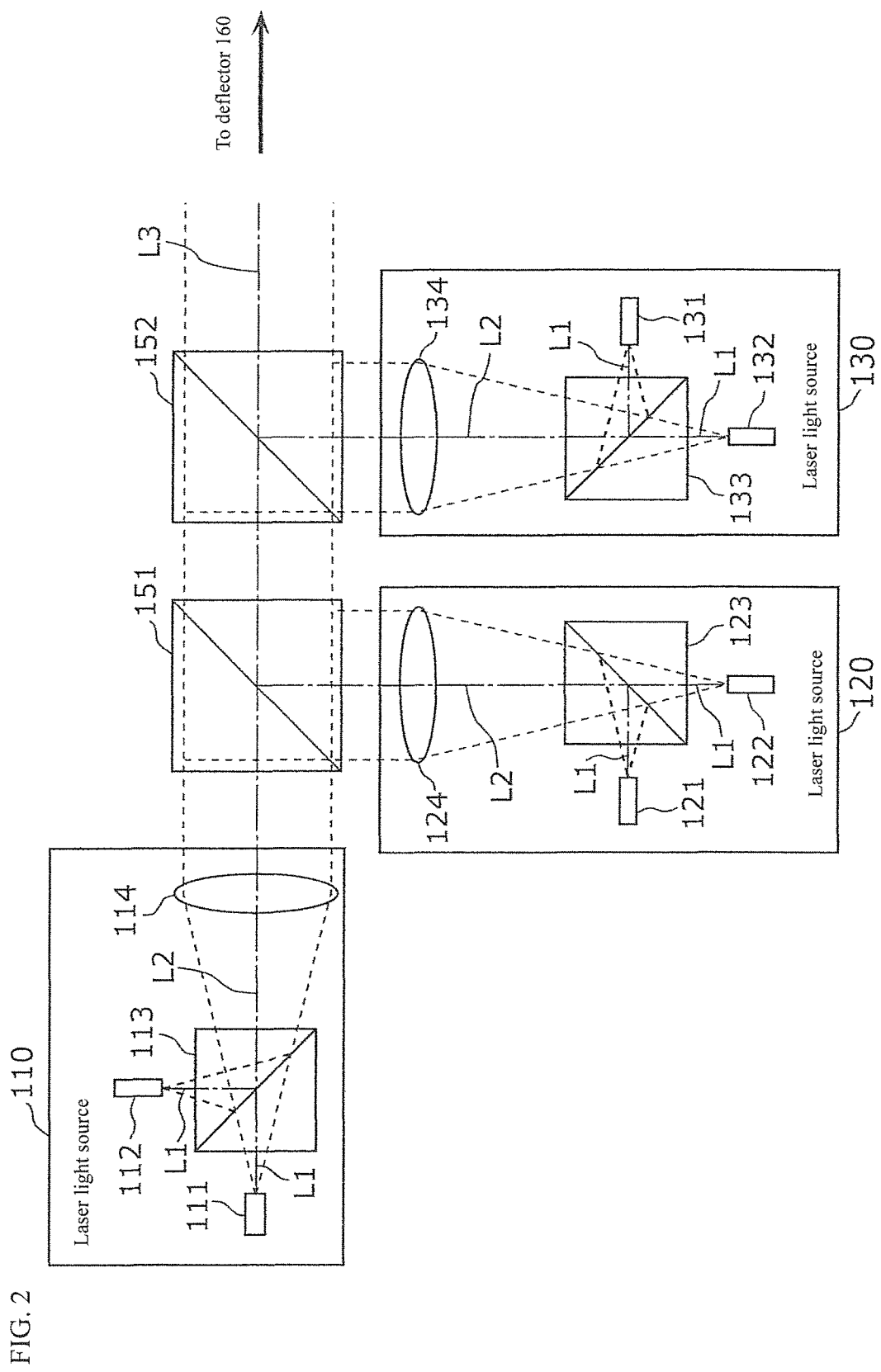
FIG. 2 shows a block diagram illustrating an example of a functional configuration of a laser light source according to one or more embodiments of the invention.

FIG. 2 is a block diagram illustrating an example of a functional configuration of the laser light sources 110, 120, 130. In FIG. 2, together with the laser light sources 110, 120, 130, the beam combiners 151, 152 are illustrated.

Because the laser light sources 110, 120, 130 each have equivalent configurations, below, the configuration of the laser light source 110 will be described as representative. The description below also applies to the laser light sources 120, 130 by replacing reference signs of corresponding components.

As illustrated in FIG. 2, the laser light source 110 has emission points 111, 112; a beam combiner 113 (a second combiner), and a collimator lens 114.

Each of the emission points 111, 112 emits a first laser light L1 of a wavelength belonging to a color corresponding to the laser light source 110. The emission points 111, 112 may comprise, for example, laser diodes of a single beam output type as discrete components enclosed in separate packages. The wavelengths of the first laser lights L1 emitted from the emission points 111, 112 do not need to strictly match, and there may be an error in a range where, for example, they are viewed as one color from among red, green, and blue used in a color image projection apparatus.

The beam combiner 113 combines the plurality of first laser lights L1 into the one second laser light L2. The beam combiner 113 may comprise, for example, a polarizing beam splitter.

The collimator lens 114 converts the second laser light L2 into a substantially parallel light. The second laser light L2 may be a strictly parallel light or a parallel light including an error stemming from a precision of the optical system. Moreover, the second laser light L2 may be intentionally made to be a convergent light that narrows slightly from a parallel light and may be converged on the screen 200.

Here, the beam combiner 113 and the collimator lens 114 configure a beam shaper in the laser light source 110.

Next, a configuration and an operation of the laser driver 170 will be described.

Figure 3:
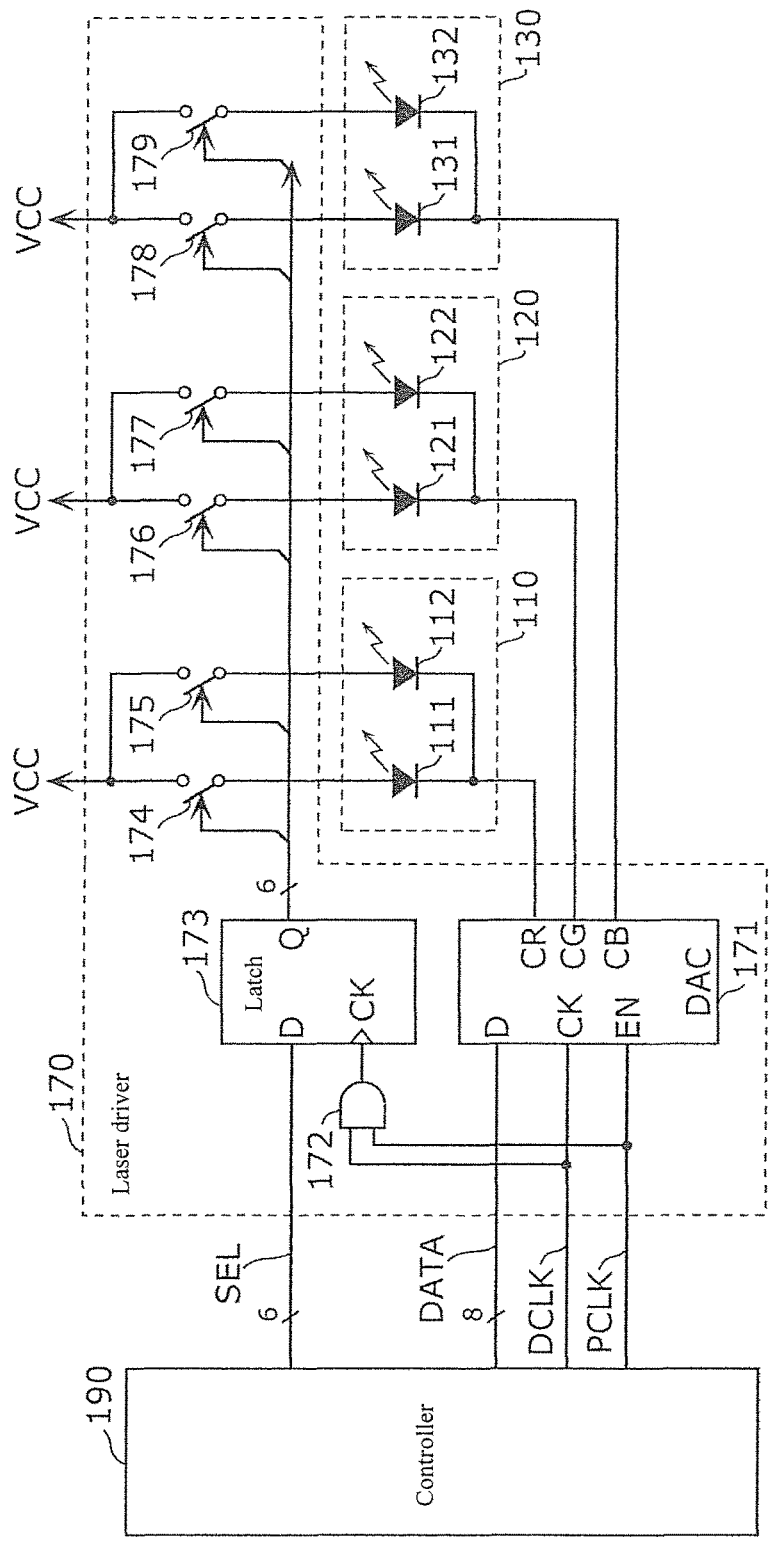
FIG. 3 shows a block diagram illustrating an example of a functional configuration of a laser driver according to one or more embodiments of the invention.

FIG. 3 is a block diagram illustrating an example of a functional configuration of the laser driver 170. In FIG. 3, together with the laser driver 170, the laser light sources 110, 120, 130 and the controller 190 are illustrated. In the example of FIG. 3, for example, in the laser light source 110, the emission points 111, 112 are connected by a common cathode; this is similarly the case for the laser light sources 120, 130 as well.

As illustrated in FIG. 3, the laser driver 170 has a DAC (digital-analog converter) 171, an AND gate 172, a latch 173, and switches 174 to 179.

The controller 190 supplies a data signal DATA, a selection signal SEL, a data clock signal DCLK, and a pixel clock signal PCLK to the laser driver 170.

Here, the data signal DATA indicates by a digital value an amount of the drive current to be supplied to each of the laser light sources 110, 120, 130. The selection signal SEL indicates by a binary value whether to supply the drive current to each emission point 111, 112, 121, 122, 131, 132. The data clock DCLK indicates synchronization of the data signal DATA. The pixel clock PCLK indicates synchronization of pixels.

Figure 5:
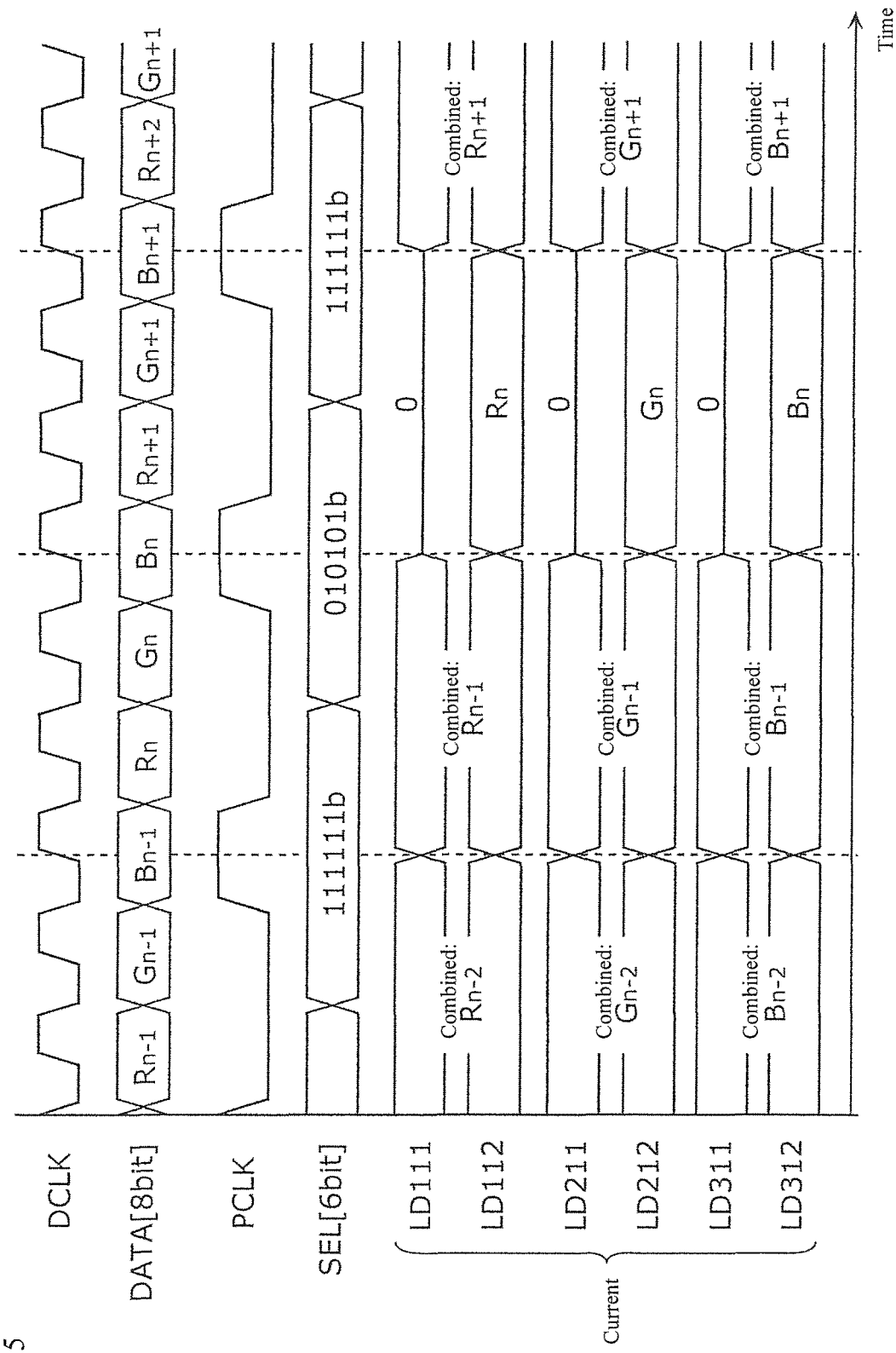
FIG. 5 shows a timing chart illustrating an example of temporal changes of principal input and output signals of the laser driver according to one or more embodiments of the invention.

FIG. 5 is a timing chart illustrating an example of the data signal DATA, the selection signal SEL, the data clock signal DCLK, and the pixel clock signal PCLK and an example of a current amount supplied to the emission points (abbreviated as "LD" in the diagram) 111, 112, 121, 122, 131, 132 according to these signals.

In the laser driver 170, the DAC 171 acquires the data signal DATA in synchronization with the data clock DCLK and generates the drive current of the amount indicated by the acquired data signal DATA in synchronization with the pixel clock PCLK for each laser light source 110, 120, 130.

The AND gate 172 generates a latch trigger signal by seeking a logical product of the data clock DCLK and the pixel clock PCLK.

The latch 173 latches the selection signal SEL by pixel clock PCLK according to the latch trigger signal and outputs the latched selection signal as a control signal of the switches 174 to 179.

The switches 174 to 179 are respectively provided in a route of the drive current of the emission points 111, 112, 121, 122, 131, 132 and switch between supplying and cutting off the drive current to the corresponding emission point by becoming conductive or nonconductive according to the selection signal SEL. For example, one drive current generated for the laser light source 110 being supplied to one of the emission points 111, 112 or being distributed to both emission points switches according to an operation of the switches 174, 175 according to the selection signal SEL. With the laser light sources 120, 130 as well, similarly, a supply destination of the drive current switches according to an operation of the corresponding switches.

Next, a correspondence between light intensity and amount and supply destination of the drive current will be described.

FIG. 4 is a diagram illustrating an example of correspondence information indicating the correspondence between the light intensity and the amount and the supply destination of the drive current. The correspondence information illustrated in FIG. 4 indicates the amount of the drive current supplied to the laser light source 110 and to which emission point, 111 or 112, to supply the drive current in correspondence with the plurality of different intensities of the laser light (the second laser light L2 above) emitted from the laser light source 110. With the laser light sources 120, 130 as well, a correspondence between the light intensity and the amount and the supply destination of the drive current is indicated by similar correspondence information. Such correspondence information may be expressed by any known method, such as a numerical table or a formula.

The correspondence information associates the light intensity and the amount and the supply destination of the drive current by a conceptualization such as follows.

First, the management range is defined in relation to the respective light intensities of the laser light sources 110, 120, 130. The management range is defined as a range of the intensity of the laser light obtained from the laser light source when one drive current is distributed to both emission points included in the laser light source and where at least one of the emission points operates in the predetermined unstable region including the mode competition region.

The correspondence information, for each of the plurality of light intensities included in the management range, indicates as the amount of the drive current a current amount where a second laser light of the intensity can be obtained by supplying to one of the plurality of emission points and indicates this one emission point from among the plurality of emission points as the supply destination of the drive current.

Furthermore, the correspondence information, for each of the plurality of light intensities not included in the management range, indicates as the amount of the drive current a current amount where a second laser light of the intensity can be obtained by supplying to all of the plurality of emission points and indicates all of the plurality of emission points as the supply destination of the drive current.

Detailed description will be continued on technical meanings of such an unstable region, management range, and current amount and supply destination of a drive current in accordance with one or more embodiments.

FIG. 6 is a diagram for describing the unstable region and the management region.

The graphs of FIG. 6(a), (b) illustrate a relationship between the drive current and the light intensity when the emission points 111, 112 each independently emit. As described earlier with reference to FIG. 13, the mode competition region is present in these individual emission properties.

The unstable region including such a mode competition region is established in advance. The unstable region may be, for example, a region that widens a width of the mode competition region by a predetermined safety margin and may be defined by a current range established in advance around a threshold of the emission point. Such a current range may be established by, for example, a ratio relative to a threshold current. As an example, when the threshold current is 50 mA and ±30% of the threshold current is made to be the unstable region, a range of a drive current of 35 mA to 65 mA is defined as the unstable region.

As illustrated in FIG. 6(a), (b), the unstable regions of the emission points 111, 112 may be defined by a current range combining a current range of a first width on an upper side and a current range of a second width on a lower side from respective thresholds Ith1, Ith2 of the emission points 111, 112. Generally the threshold Ith1 and the threshold Ith2 are different, and in the example illustrated in FIG. 6(a), (b), the threshold Ith2 is smaller than the threshold Ith1.

The graph of FIG. 6(c) illustrates a relationship between a drive current and a total light intensity when one drive current is distributed to both emission points 111, 112 (also referred to as complete lighting). In complete lighting, the drive current is distributed to both emission points 111, 112 at a ratio according to the properties of the emission points 111, 112. According to this distribution, the management range of the light intensity described above is specified as follows.

When a drive current that distributes a current Ia1 of an upper limit of the unstable region to the emission point 111 is made to be Ia1+Ia2, in accordance with such a drive current Ia1+Ia2, a remaining current Ia2 is distributed to the emission point 112. When the light intensities obtained at the emission points 111, 112 by the currents Ia1, Ia2 are respectively defined as Pa1, Pa2, an upper limit of the management range is specified by a total light intensity Pa1+Pa2.

Furthermore, when a drive current that distributes a current Ib2 of a lower limit of the unstable region to the emission point 112 is made to be Ib1+Ib2, in accordance with such a drive current Ib1+Ib2, a remaining current Ib1 is distributed to the emission point 111. When the light intensities obtained at the emission points 111, 112 by the currents Ib1, Ib2 are respectively defined as Pb1, Pb2, a lower limit of the management range of the light intensity is specified by a total light intensity Pb1+Pb2.

In this manner, the management range, which is the range of the light intensity obtained in total in the situation where one drive current is distributed to both emission points 111, 112 and at least one of the emission points 111, 112 operates in the unstable region (that is, a range from a light intensity Pb to a light intensity Pa), is specified. As a result, the values of the total light intensity P may be grouped into three ranges: a first range where $0<=P<Pb$; a second range or the management range where $Pb<=P<=Pa$; and a third range where $Pa<P<=Po$.

Currents Io1, Io2 illustrated in FIG. 6 represent respective rated currents of the emission points 111, 112, and light intensities Po1, Po2 represent respective rated light intensities of the emission points 111, 112.

As described above, when the laser light of a light intensity included in the management region is generated by complete lighting at the laser light source 110, there is a concern that at least one of the emission points 111, 112 will operate in the unstable region. Therefore, when the target intensity of the laser light generated by the laser light source 110 is included in the management range, the drive current is supplied to only one of the emission points 111, 112 (also referred to as partial lighting). Moreover, supplied is a drive current of an amount where the laser light of the target intensity can be obtained by the emission point 111 or 112 alone.

If the image projection apparatus includes two laser light sources, and the two laser light sources have properties that meet the following condition (1), the two laser light sources may emit laser lights without using the unstable region.

$$Pb1+Pb2>=\mathrm{Min}(Pa1,Pa2) \quad (1)$$

Pa1 is an upper limit of light intensities in the mode competition region on the first laser light source, Pb1 is a lower limit of light intensities in the mode competition region on the first laser light source, Pa2 is an upper limit of light intensities in the mode competition region on the second laser light source, and Pb2 is a lower limit of light intensities in the mode competition region on the second laser light source. Thus, if Pa1=Pa2 (=Pa) and Pb1=Pb2 (=Pb), the condition becomes as follows:

$$2Pb>=Pa \quad (2)$$

When these conditions are met, brightness of a projected image on the screen becomes stable in the entire range of the light intensity.

FIG. 7 is a diagram for describing the amount of the drive current for generating by partial lighting the laser light of an intensity included in the management range.

Graphs in FIG. 7(a), (b) are the same as the graphs of FIG. 6(a), (b). In the example FIG. 7(c), to obtain the laser light of an intensity in the management range, only the emission point 112 is caused to emit (partially lighted).

In FIG. 7(b), drive currents for obtaining light intensities of a lower limit Pb and an upper limit Pa of the management range with the emission point 112 alone are Ib and Ia, respectively. Therefore, in the partial lighting of FIG. 7(c), the laser light of the target intensity included in the management range is generated by supplying a drive current in a range from Ib to Ia to the emission point 112 alone.

Such an unstable region, management range, and current amount and supply destination of a drive current may be specified by, for example, actual measurement as long as they are specified based on the above conceptualization and may also be specified by any known method, such as simulation, logical calculation, or referencing catalog specifications.

The management range and the amount and the supply destination of the drive current specified in this manner are held as correspondence information of FIG. 5.

The controller 190 may hold in advance the correspondence information illustrated in FIG. 5 for each of the laser light sources 110, 120, 130. The controller 190 may generate a data signal DATA and a selection signal SEL indicating a current amount and a supply destination of a drive current associated with a light intensity of each pixel by the held correspondence information and supply these to the laser driver 170.

By this, operating in the unstable region is avoided, and as a result, the laser light of an intensity in the management range is stably obtained.

As illustrated in FIG. 7(c) for example, in partial lighting, the drive current is supplied only to the emission point 112. In this manner, in partial lighting, lighting an emission point with a smaller threshold may increase the likelihood of generating the laser light of a light intensity in the management range by a smaller drive current, and this is advantageous in terms of power saving for the image projection apparatus 100.

Furthermore, in the above description, two emission points are provided in each of the laser light sources 110, 120, 130, but a number of emission points provided in one laser light source is not limited. The number of emission points may be three or more and may differ with each laser light source. The number of emission points provided in one laser light source may be established, for example, according to a maximum intensity of a laser light that is necessary.

Furthermore, in complete lighting, every emission point is lighted, and in partial lighting, emission points of a number that is one or more and not every emission point may be lighted. The number of emission points provided in one laser light source and the number of emission points lighted in partial lighting may be established in consideration of emission properties of individual emission points so that, for example, the light intensity obtained by partial lighting matches a light intensity in the management range.

Example 2

In comparison with the image projection apparatus according to Example 1, an image projection apparatus according to Example 2 differs in a configuration of a laser light source.

Figure 8:
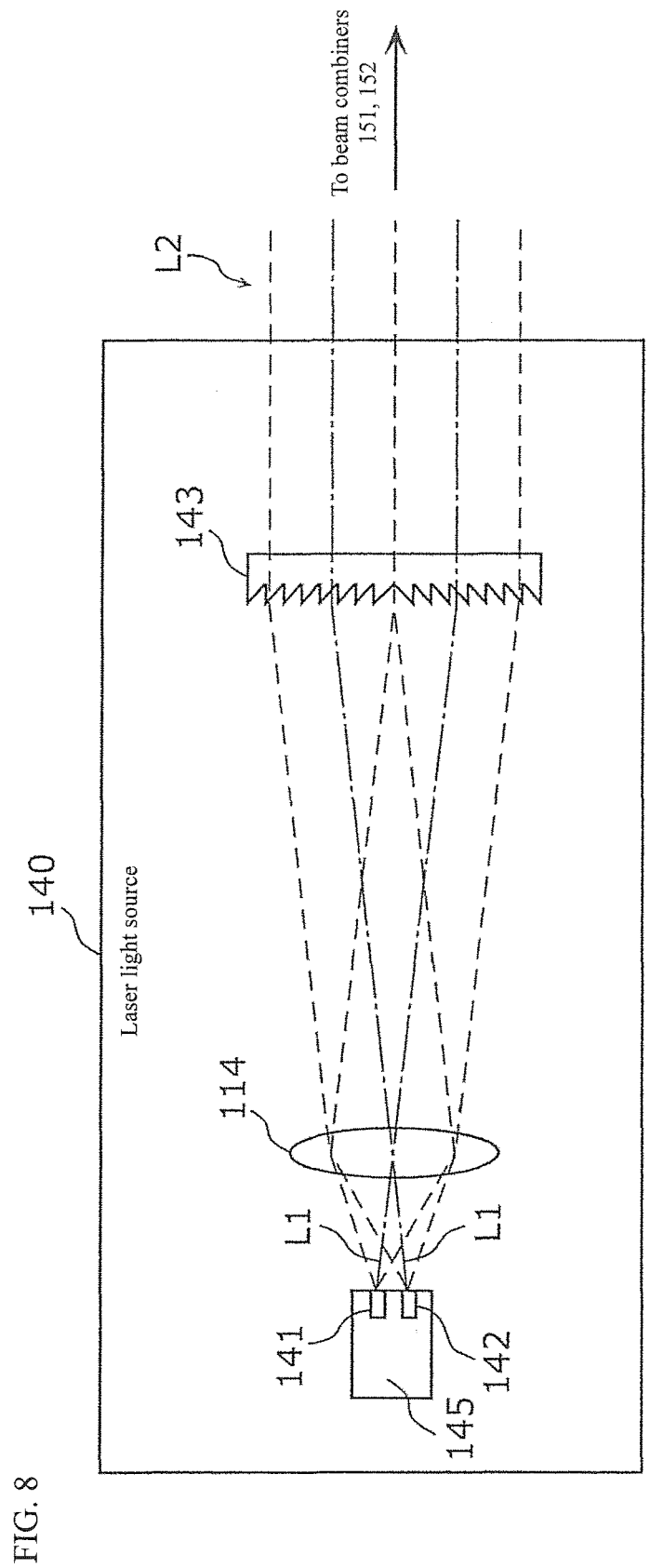
FIG. 8 shows a block diagram illustrating an example of a functional configuration of a laser light source according to one or more embodiments of the invention.

FIG. 8 is a block diagram illustrating an example of a functional configuration of a laser light source according to one or more embodiments of the invention. A laser light source 140 illustrated in FIG. 8 replaces the laser light sources 110, 120, 130 of the image projection apparatus 100 according to one embodiments of Example 1.

The laser light source 140 has a semiconductor chip 145 formed with emission points 141, 142; a collimator lens 114; and a diffraction grid plate 143.

Each of the emission points 141, 142 emits a first laser light L1 of a wavelength belonging to a color corresponding to the laser light source 140. The emission points 141, 142 may comprise, for example, laser diodes of a multi beam output type as discrete components enclosed in a single package.

The collimator lens 114 converts each of the plurality of first laser lights L1 into a substantially parallel light.

The diffraction grid plate 143 receives each of the plurality of first laser lights L1 after conversion into the substantially parallel light in different regions and diffracts these in substantially identical traveling directions.

The laser light source 140 emits the plurality of first laser lights L1 whose traveling directions are aligned by the diffraction grid plate 143 as the second laser light L2.

Figure 9:
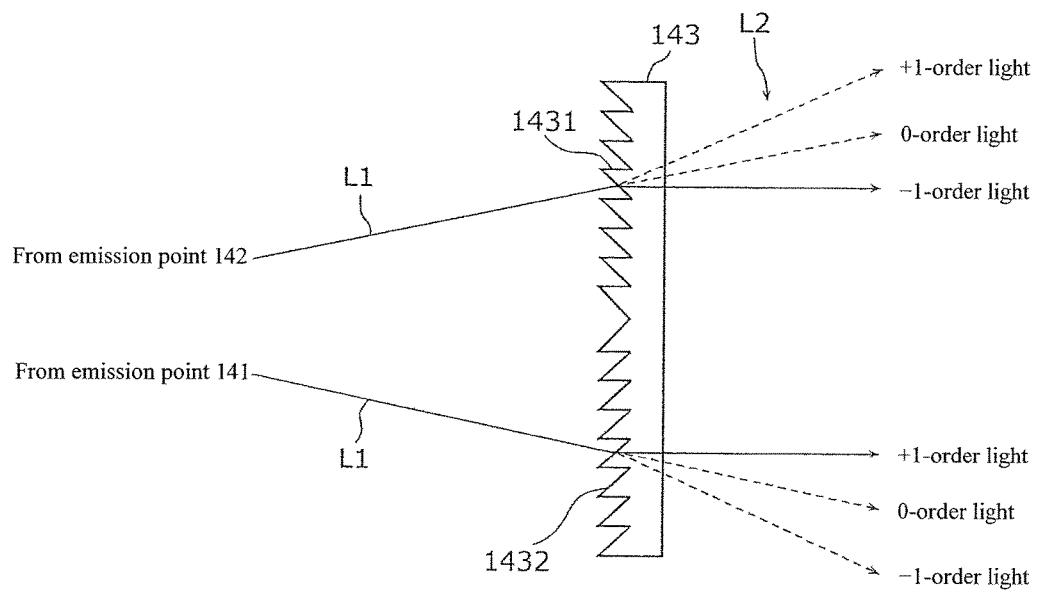
FIG. 9 shows a conceptual diagram illustrating an example of a detailed configuration of a diffraction grid plate according to one or more embodiments of the invention.

FIG. 9 is a conceptual diagram illustrating an example of a detailed configuration of the diffraction grid plate 143.

As illustrated in FIG. 9, the diffraction grid plate 143 receives a first laser light L1 from the emission point 142 at a region 1431 and receives a first laser light L1 from the emission point 141 at a region 1432.

In the region 1431, a diffraction grid that strongly emits a −1-order light of the first laser light L1 incident from the emission point 142 is provided, an in the region 1432, a diffraction grid that strongly emits a +1-order light of the first laser light L1 incident from the emission point 141 is provided. Traveling directions of the −1-order light and the +1-order light are substantially the same direction. The diffraction grids may comprise, for example, a surface having serrations, where a cross-sectional shape of grooves is serrated (e.g., a brazed surface).

In the image projection apparatus according to Example 2, by using a laser light source 140 configured in this manner instead of the laser light sources 110, 120, 130 of the image projection apparatus 100 according to Example 1, effects equivalent to the effects described for the image projection apparatus 100 of one embodiment of Example 1 can be obtained.

Example 3

According to Example 2, an example of the laser light source 140 where the emission points 141, 142; the collimator lens 114; and the diffraction grid plate 143 are disposed in this order in the traveling direction of the laser light is described, but a disposition of the components of the laser light source is not limited to this example. In Example 3, a laser light source whose disposition of components differs is explained.

Figure 10:
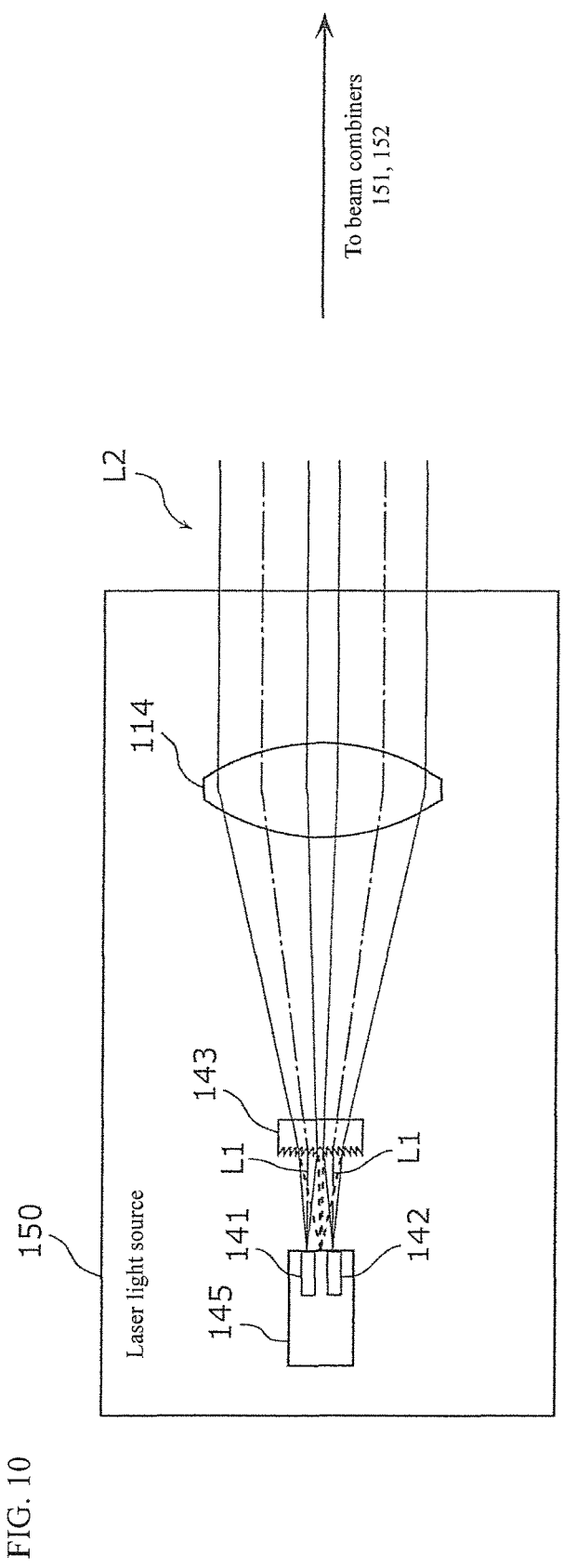
FIG. 10 shows a block diagram illustrating an example of a functional configuration of a laser light source according to one or more embodiments of the invention.

FIG. 10 is a diagram illustrating an example of a configuration of a laser light source according to one or more embodiments of the invention.

As illustrated in FIG. 10, in comparison to the laser light source 140 illustrated in FIG. 8, a laser light source 150 differs in that an ordering of the collimator lens 114 and the diffraction grid plate 143 is reversed. That is, in the laser light source 150, the emission points 141, 142; the diffraction grid plate 143; and the collimator lens 114 are disposed in this order in the traveling direction of the laser light.

Figure 11:
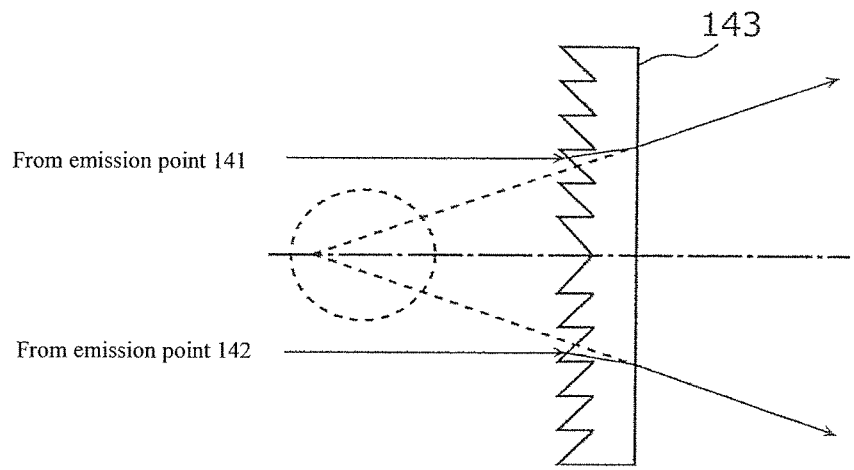
FIG. 11 shows a conceptual diagram illustrating an example of a detailed configuration of the diffraction grid plate according to one or more embodiments of the invention.

FIG. 11 is a conceptual diagram illustrating an example of a detailed configuration of the diffraction grid plate 143.

As illustrated in FIG. 11, the diffraction grid plate 143 in the laser light source 150 receives each first laser light L1 emitted from the emission points 141, 142 at different regions and diffracts these in an orientation where emission can be deemed as being from one point on an optical axis of the collimator lens 114. By this, respective virtual images of the emission points 141, 142 can be matched.

In the image projection apparatus according to Example 3, by using a laser light source 150 configured in this manner instead of the laser light sources 110, 120, 130 of the image projection apparatus 100 according to Example 1, effects equivalent to the effects described for the image projection apparatus 100 of Example 1 can be obtained.

Next, an example that improves a function of the image projection apparatuses according to the above embodiments will be described. It is generally known that, in a situation of continuously driving a specified laser light source, a temperature of a laser chip increases and an output of the laser light fluctuates, thereby generating color unevenness in the projected image. In the embodiment below, an image projection apparatus can be provided that can suppress generation of color unevenness in a projected image even if a laser light source continuously emits a laser light.

The example that will be described below may be realized in combination with a function of the image projection apparatus according to the above embodiments or realized independently. In the description below, to simplify description, a portion of the description of the function already described will be omitted.

Example 4

<Configuration>

Figure 14:
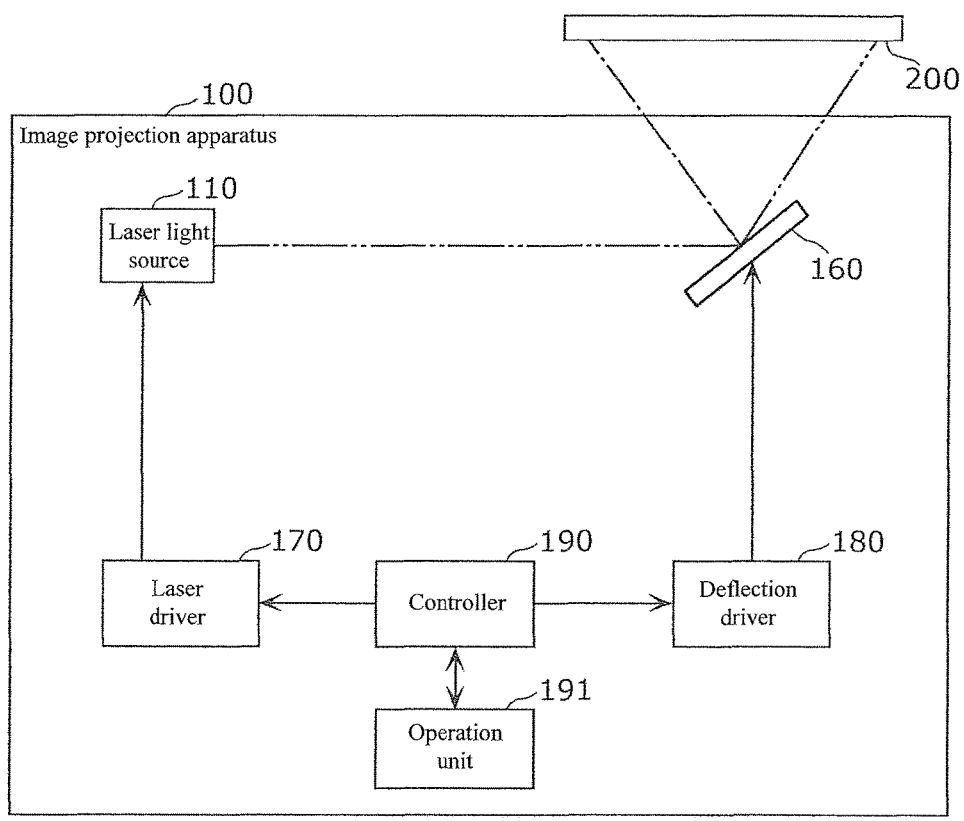
FIG. 14 shows a diagram illustrating an example of a configuration of the image projection apparatus according to one or more embodiments of the invention.
Figure 15:
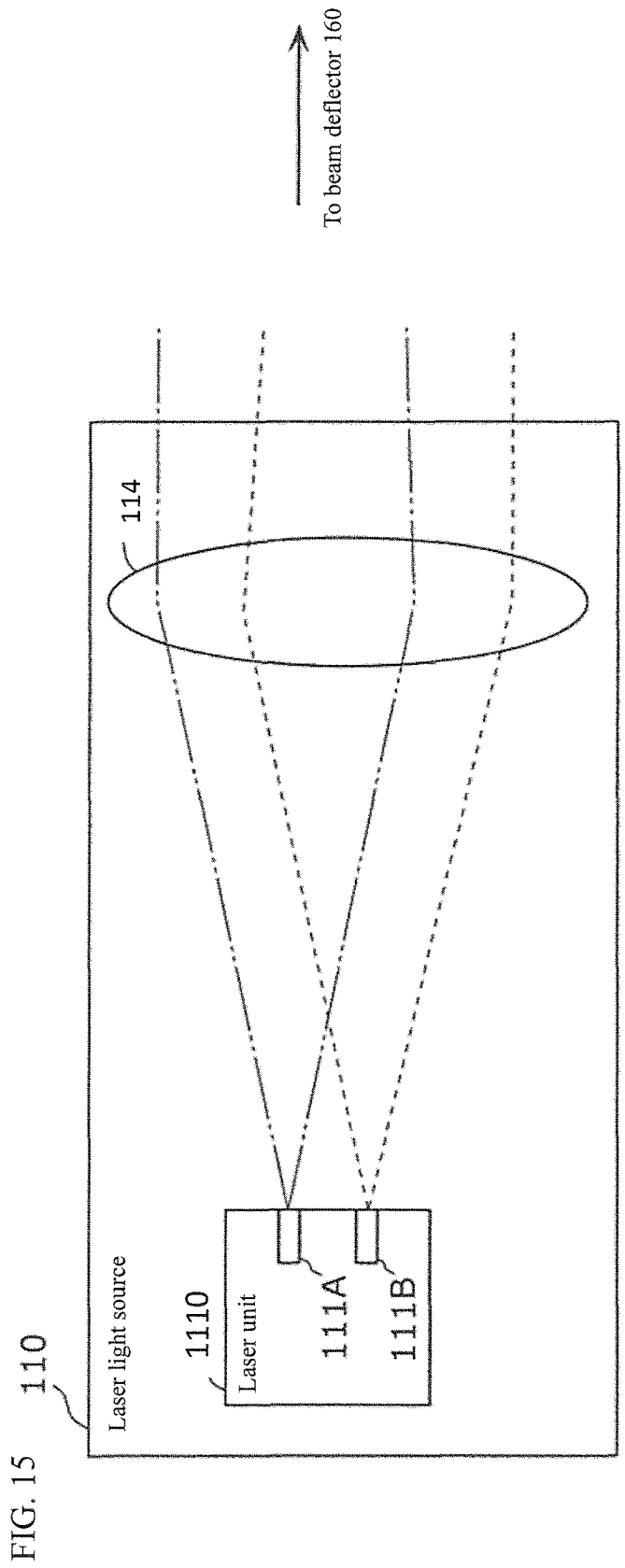
FIG. 15 shows a diagram illustrating an example of a configuration of the laser light source according to one or more embodiments of the invention.
Figure 16:
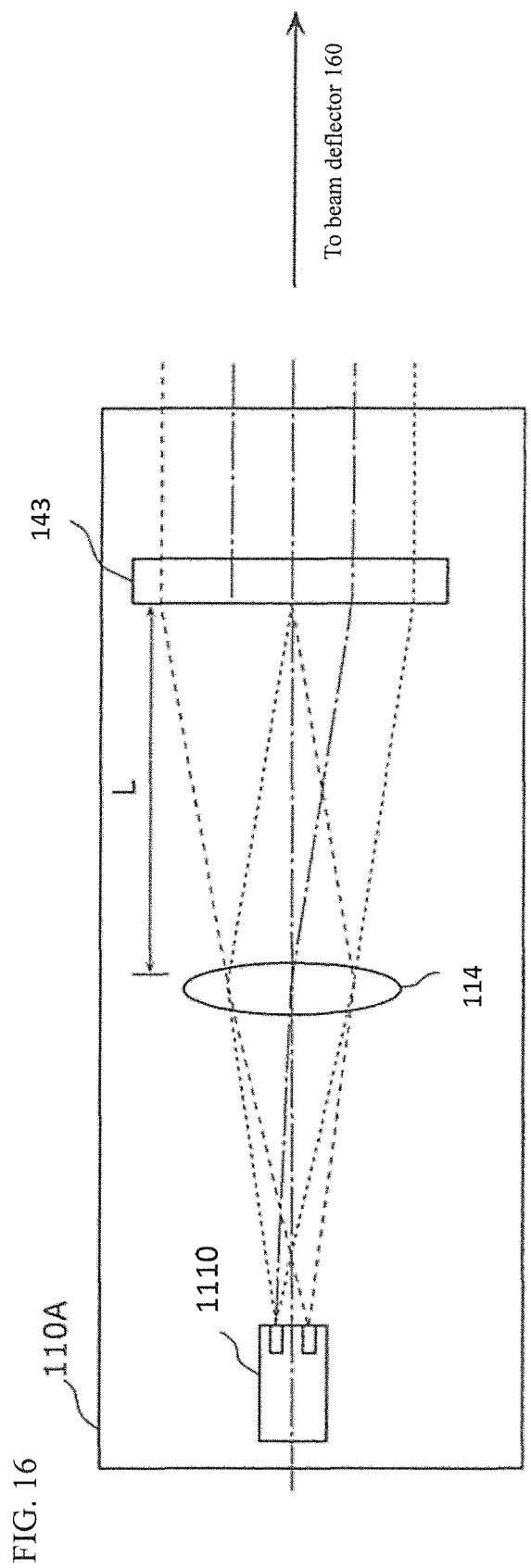
FIG. 16 shows a diagram illustrating another example of a configuration of a laser light source according to one or more embodiments of the invention.

FIG. 14 is a diagram illustrating an example of a configuration of the image projection apparatus 100 according to one or more embodiments of the invention. FIG. 15 is a diagram illustrating an example of a configuration of the laser light source 110 according to one or more embodiments of the invention. FIG. 16 is a diagram illustrating another example of the laser light source 110 according to one or more embodiments of the invention.

The image projection apparatus 100 is a laser projector for projecting the image to the screen 200. As illustrated in FIG. 14, the image projection apparatus 100 comprises the laser light source 110, the beam deflector 160, the laser driver 170, the deflection driver 180, the controller 190, and the operation unit 191. The screen 200 is an example of a projection surface to which the image is projected by the image projection apparatus 100. Moreover, in FIG. 14, the image projection apparatus 100 does not have the laser light sources 120, 130 illustrated in FIG. 1, but these laser light sources 120, 130 may be provided.

The controller 190 controls the laser driver 170 and the deflection driver 180. The controller 190 is configured as a computer system made from, for example, a CPU (central processing unit), a RAM (random-access memory), a ROM (read-only memory), and the like. A portion of or all functions of the controller 190 may be achieved by the CPU using the RAM as a working memory to execute a program recorded in the ROM. Moreover, a portion or all of the functions of the controller 190 may be achieved by a dedicated hardware circuit.

The operation unit 191 accepts an operation by the user, such as the operation of turning on the image projection apparatus 100, an operation of changing a projection angle of the image, and an operation of changing a color or a brightness of the image. The operation unit 191 may comprise, for example, a hardware button or a software button and may comprise a remote controller and a receiver that receives a radio wave sent from the remote controller.

The laser light source 110 emits the laser light. For example, the laser light source 110 has two or more emission points that respectively emit laser lights of substantially identical wavelengths at time divisions and a first optical element that converts the laser lights emitted from the two or more emission points into substantially parallel lights. The two or more emission points do not emit the laser lights simultaneously but emit them by being sequentially switched. Here, for example, when the two or more emission points are two emission points, the two emission points emit the laser lights switching alternately. Moreover, as illustrated in FIG. 1, the image projection apparatus 100 may have a plurality of laser light sources.

In one or more embodiments of the present example, as illustrated in FIG. 15 for example, the laser light source 110 comprises a laser unit 1110 and the collimator lens 114 and emits, for example, a red laser light to the beam deflector 160.

The laser unit 1110 has the two or more emission points that respectively emit the laser lights of the substantially identical wavelengths at time divisions. Here, the two or more emission points may be configured by a one-chip or by individual chips. In one or more embodiments of the present example, the laser unit 1110 will be described as having two emission points (emission point 111A and emission point 111B).

The collimator lens 114 is an example of the first optical element and converts the laser lights emitted from the two or more emission points into substantially parallel lights. In one or more embodiments of the present example, the collimator lens 114 converts a laser light emitted from the emission point 111A or the emission point 111B into a substantially parallel light. Here, an optical center axis of the collimator lens 114 is disposed so as to be in a center of the emission point 111A and the emission point 111B. Because of this, the laser light emitted from the emission point 111A or the emission point 111B, after passing through the collimator lens 114, becomes a substantially parallel light heading toward the beam deflector 160.

The laser light source 110 is not limited to the configuration illustrated in, for example, FIG. 15 and may further comprise the diffraction grid plate 143 as in, for example, a laser light source 110A illustrated in FIG. 16.

The diffraction grid plate 143 is an example of a second optical element and deflects a light beam of the laser lights emitted from the two or more emission points. For example, the diffraction grid plate 143 is disposed between the first optical element and a deflection device and deflects toward the deflection device the laser lights emitted from the two or more emission points and converted into the substantially parallel lights by the first optical element. In one or more embodiments of the present example, the diffraction grid plate 143 makes the substantially parallel laser light that is emitted from the emission point 111A or the emission point 111B and passed through the collimator lens 114 into a parallel laser light having the same traveling direction heading toward the beam deflector 160.

Furthermore, the diffraction grid plate 143 is disposed in a position separated by a distance L from the collimator lens 114. By being disposed in this manner, after emission from the emission point 111A or the emission point 111B and passing through the collimator lens 114, the light bundle of the laser lights after passing through the diffraction grid plate 143 can be guided completely to the beam deflector 160.

Figure 17:
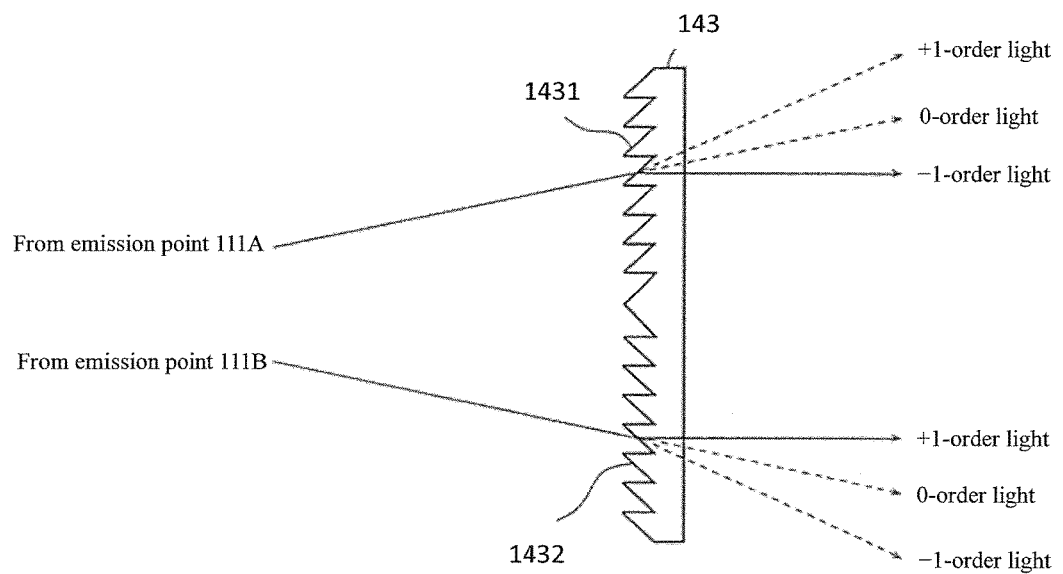
FIG. 17 shows a diagram illustrating an example of a configuration of the diffraction grid plate according to one or more embodiments of the invention.

FIG. 17 is a diagram illustrating an example of a configuration of the diffraction grid plate 143 according to one or more embodiments of the invention.

That is, the diffraction grid plate 143 has the region 1431 and the region 1432 having the surface where the cross-sectional shape of the grooves is serrated (brazed surface) on a collimator-lens 114 side.

The brazed surface of the region 1431 and the region 1432 is optimized to an oscillation wavelength of the laser unit 1110. Because of this, as illustrated in FIG. 17, in the region 1431, only the −1-order light is emitted to be diffracted in a direction along the optical axis of the collimator lens 114, and in the region 1432, only the +1-order light is emitted to be diffracted in the direction along the optical axis of the collimator lens 114.

In this manner, by further providing the diffraction grid plate 143, the laser light source 110 can combine two laser lights of substantially the same wavelength into parallel lights that propagate in the same direction without using a polarizing prism.

The beam deflector 160 is an example of the deflection device that deflects the laser light from the laser light source 110 toward the screen 200. In one or more embodiments of the present example, the beam deflector 160 is a biaxial MEMS mirror and scans the laser light by driving in the two axes of a horizontal direction (X direction) and a vertical direction (Y direction). The beam deflector 160, by this two-dimensional deflection scanning, forms the image (two-dimensional image) by projecting the laser light from the laser light source 110 to a surface of the screen 200. Drive control of the beam deflector 160 is performed by the deflection driver 180 that will be described below.

The deflection driver 180 changes an inclination of the beam deflector 160 by supplying a drive signal to the beam deflector 160. In other words, the deflection driver 180 scans the laser light emitted from the laser light source 110 over the screen 200 by controlling the inclination of the beam deflector 160. By this, the deflection driver 180 can project the image to the screen 200.

The laser driver 170 adjusts a light amount of the laser light source 110 by supplying the drive current to the laser light source 110. The laser driver 170 selects one of the two or more emission points had by the laser light source 110 at time divisions and supplies a corresponding drive current to the selected one emission point from among the two or more to switch the two or more emission points at time divisions and cause the two or more emission points to emit the laser lights at time divisions.

For example, the laser driver 170, by switching the two or more emission points according to the pixel clock, which is a frequency at which each pixel configuring the image projected to the screen 200 is updated, can cause the two or more emission points to emit the laser lights at time divisions. Here, the laser driver 170 may cause the two or more emission points to emit the laser lights at time divisions by switching the two or more emission points according to a frequency that updates a plurality of pixels among the pixels configuring the image.

Furthermore, for example, the laser driver 170, by switching the two or more emission points according to an operation clock, may cause the two or more emission points to emit the laser lights at time divisions. Here, the operation clock may be one clock or a plurality of clocks. That is, the laser driver 170, by switching at each of a plurality of clocks as the operation clock, may cause the two or more emission points to emit the laser lights at time divisions. Moreover, the operation clock may be a timing at which the laser driver 170 incorporates data (data clock).

<Configuration of Laser Driver>

Figure 18:
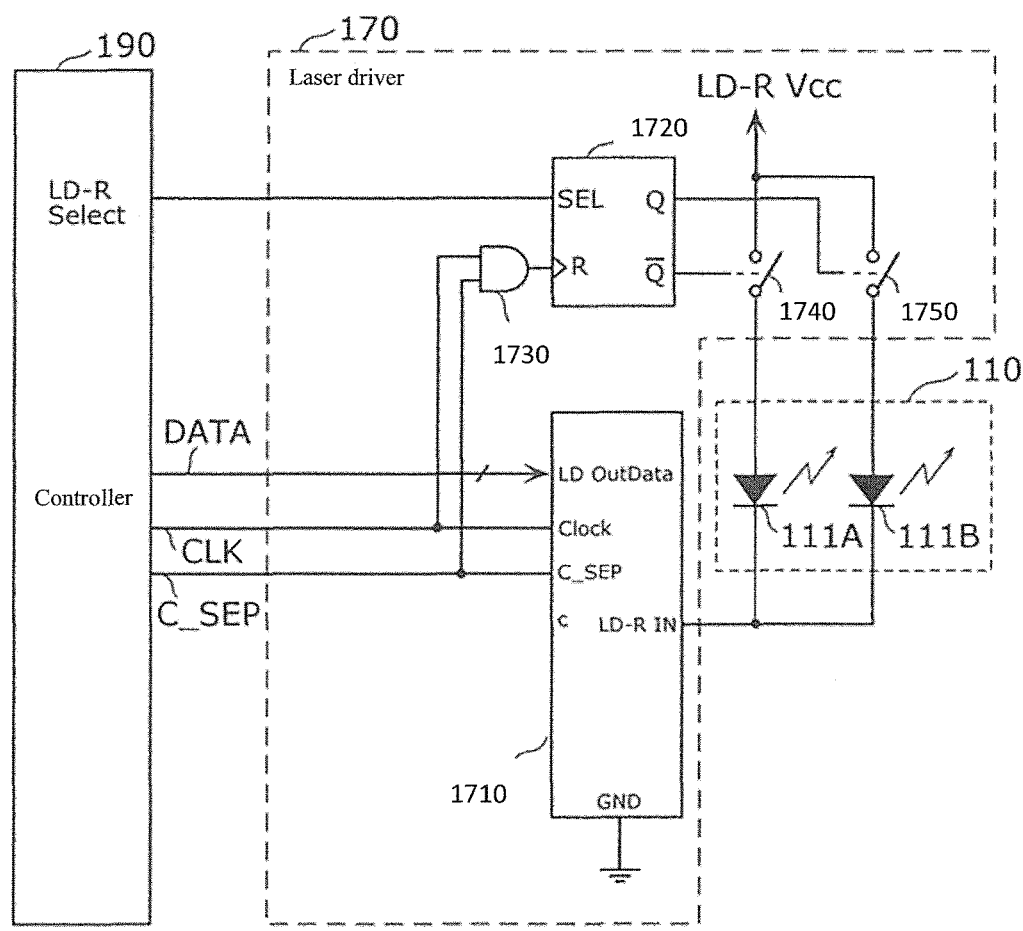
FIG. 18 shows a diagram illustrating an example of a configuration of the laser driver according to the one or more embodiments of the invention.

FIG. 18 is a diagram illustrating an example of a configuration of the laser driver 170 according to one or more embodiments of the invention.

As illustrated in FIG. 18, the laser driver 170 comprises a register circuit 1710, a selection circuit 1720, an AND circuit 1730, a switch 1740, and a switch 1750. In the same diagram, the "DATA" signal indicates a video data signal, and the "CLK" signal indicates a clock signal of the laser driver 170.

The register circuit 1710 is input with video data (brightness value), for example, 8 bits at a time from the controller 190 and converts the input video data (brightness value) of 8 bits at a time into the drive current for driving the emission point 111A or the emission point 111B in the laser light source 110. The register circuit 1710 rewrites the drive current corresponding to the video data of 8 bits at a time at each operation clock and applies this to a cathode of the emission point 111A or the emission point 111B from an LD-RIN. The register circuit 1710 rewrites the drive current in a state where a C_SEP signal, which is a signal indicating a timing of rewriting, is H and at a timing of the CLK signal (clock signal) rising.

The selection circuit 1720 is a circuit that selects to which of the two emission points 111A or 111B of the laser light source 110 the register circuit 1710 should apply the drive current. The selection circuit 1720 selects the emission point 111A or the emission point 111B by turning on one from among the switch 1740 and the switch 1750 and turning off the other in the state where the C_SEP signal is H and at the timing of the CLK signal (clock signal) rising. Here, the selection circuit 1720 selects the emission point 111A or the emission point 111B according to an LD-R Select signal, which is a signal indicating whether to select the emission point 111A or the emission point 111B. This LD-R Select signal is supplied from the controller 190.

<Operation of Image Projection Apparatus>

Figure 19:
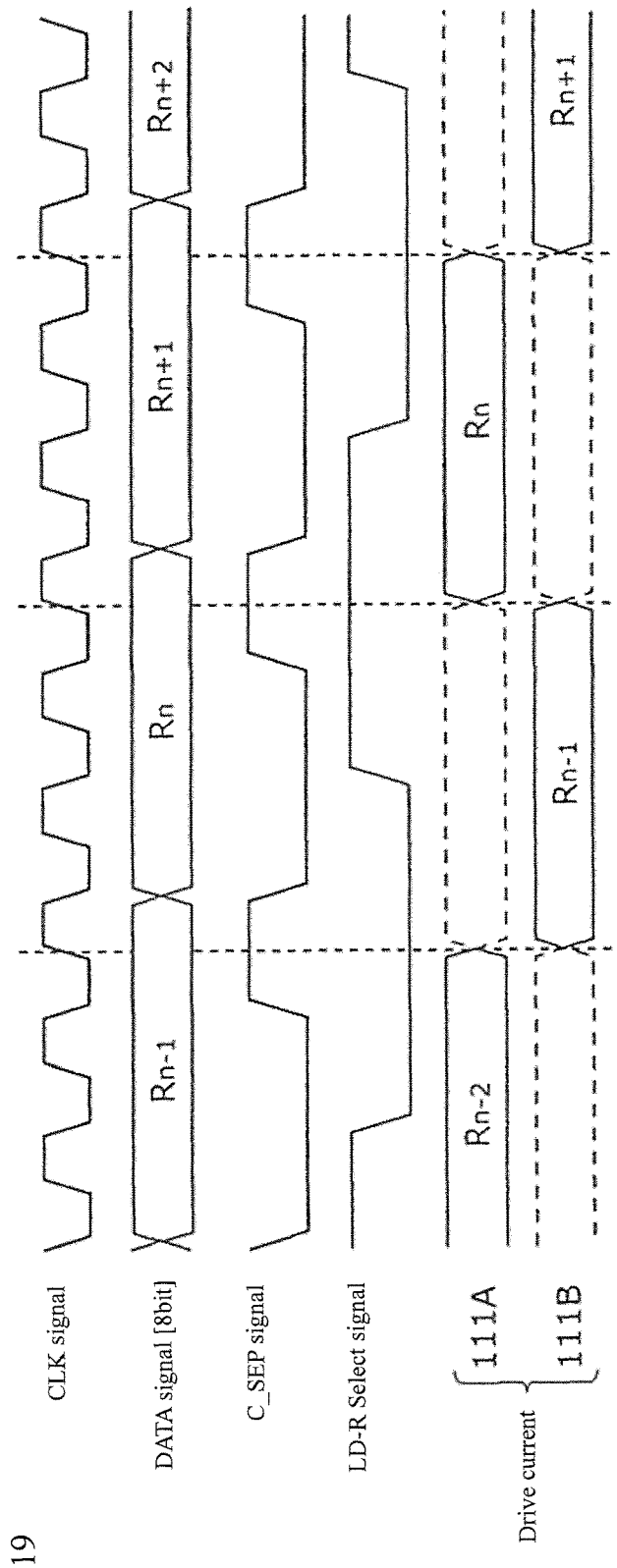
FIG. 19 shows a timing chart illustrating an example of an operation of the image projection apparatus according to one or more embodiments of the invention.

FIG. 19 is a timing chart illustrating an example of an operation of the image projection apparatus 100 according to one or more embodiments of the invention. In the example illustrated in FIG. 19, an example of a situation where the operation clock is a plurality of clocks is illustrated.

A brightness value of each pixel of image data of, for example, red, is sent to the laser driver 170 in synchronization with the operation clock and sequentially written in a register (not illustrated) of the register circuit 1710. The register circuit 1710, in the state where the C_SEP signal is H and at the timing of the CLK signal rising, switches to a current value (drive current) that is in accordance with the brightness value written in the register and that drives the emission point 111A or the emission point 111B. At this time, when the LD-R SELECT signal is H, the emission point 111A is caused to emit, and the emission point 111B is turned off. Conversely, when the LD-R SELECT signal is L, the emission point 111B is caused to emit, and the emission point 111B is turned off.

By doing so, switching can be performed at high speed between the plurality of emission points (here, the emission point 111A and the emission point 111B) according to a period of the C_SEP signal.

In this manner, by operating the image projection apparatus 100 according to one or more embodiments of the present example, emission (driving) in the two emission points (emission point 111A and emission point 111B) of the laser light source 110 is continuously in only one emission point. Moreover, by causing one to emit and turning off the other from among the two emission points of the laser light source 110, even if continuous irradiation is performed as the laser light source 110, the other from among the two emission points can be provided with a cooling period from time to time; therefore, a temperature of a laser chip configuring the laser light source 110 can be suppressed from escalating.

The operation clock may be one clock or a plurality of clocks. Moreover, the operation clock may be identical with the data clock, which has a frequency at which the laser driver 170 fetches data, or the pixel clock, which has a frequency at which each pixel configuring the projected image is updated. Moreover, the operation clock may be the frequency (timing) at which a plurality of pixels from among the pixels configuring the image is updated.

Furthermore, in the above, the laser driver 170 is described as sequentially switching one of the two or more emission points at each identical operation clock but is not limited thereto. For example, the laser driver 170 may switch the two or more emission points at time divisions every two clocks at an end portion of the image projected to the screen 200 and every three clocks in a central portion of the image projected to the screen 200. That is, the laser driver 170 may switch the two or more emission points at an operation clock of a clock number differing at the end portion and the central portion of the image projected to the screen 200.

<Effects>

In the image projection apparatus 100 according to one or more embodiments of the present example, color unevenness in the projected image can be suppressed from arising even if the laser light is continuously emitted.

For example, according to one or more embodiments of the present example, by causing one emission point to emit and turning off the others in the plurality of emission points configuring the laser light source 110, even if continuous irradiation is performed as the laser light source 110, the cooling period can be provided from time to time to the other emission points. By providing the cooling period from time to time to the other emission points, escalation of the temperature of the laser chip configuring the laser light source 110 can be suppressed; therefore, output fluctuation of the laser light due to temperature escalation of the laser chip can be suppressed, and a stable laser light output can be obtained. By this, color unevenness in the projected image can be suppressed from arising even if the laser light is continuously emitted. Here, the unit of time divisions is, for example, a unit of several ten nsec, which is a time unit smaller than an order of msec.

Furthermore, the two or more emission points can be provided with the cooling period from time to time by emitting at time divisions; therefore, not only can the output fluctuations due to the temperature escalation of the laser chip be suppressed, but an emission power per unit time can also be increased compared to when continuously emitting. For example, when the laser light source 110 comprises two emission points that are switched every one pixel, a time when the two emission points are respectively emitting at time divisions is halved compared to a normal time, that is, when only one emission point is emitting when the laser light source 110 comprises only one emission point. However, because a current value that is twice the amount compared to the current value applied in the situation of emitting by only one emission point can be applied to each of the two emission points, a brightness of the laser light source 110 comprising the two emission points can be twice that of the laser light source comprising only one emission point.

Therefore, according to one or more embodiments of the present example, emission is possible by switching lasers at time divisions in units of several ten nsec while increasing a laser output power of substantially identical wavelengths, and the laser lights irradiated at time divisions from the plurality of emission points can be deemed to be pulse emission. Moreover, the emission power per unit time of the laser light irradiated by one emission point can be increased, and while emission is possible with a single laser in a specified time, the temperature of the laser chip can be made constant regardless of the video data. By this, the output fluctuations of the laser light due to the temperature escalation of the laser chip can be suppressed, and an image projection apparatus of a laser scanning type that can obtain a stable laser light output can be realized. For example, in a situation of a projection screen of a resolution of XGA and video data of sixty frames, each emission point is driven at 40 nsec or less; therefore, a projected image of a stable brightness with no color unevenness can be obtained even in a projection image projecting to a white screen.

When the emission properties (properties of emission power) of the plurality of emission points configuring the laser light source 110 differ, each of the plurality of emission points do not need to be switched at time divisions consisting of the same time. In this situation, the laser light may be emitted by switching the two or more emission points by a duty aligning the emission powers of the laser lights emitted by the two or more emission points based on the emission properties of the two or more emission points. In this manner, the duty for causing the plurality of emission points to emit does not have to be uniform and may be a duty calculated according to the emission properties of the emission points.

The duty is not limited to a situation of being calculated according to the emission properties of the emission points and may be calculated according to, for example, emission variation due to a life of the emission points.

Example 5

In one embodiment of the Example 4, an example is described of a situation where the diffraction grid plate 143 that is the second optical element is disposed between the collimator lens 114 and the beam deflector 160, but the invention is not limited thereto. In one or more embodiments of the present example, an example of a situation where a diffraction grid plate is disposed between the laser unit 1110 and the collimator lens 114 will be described.

Figure 20:
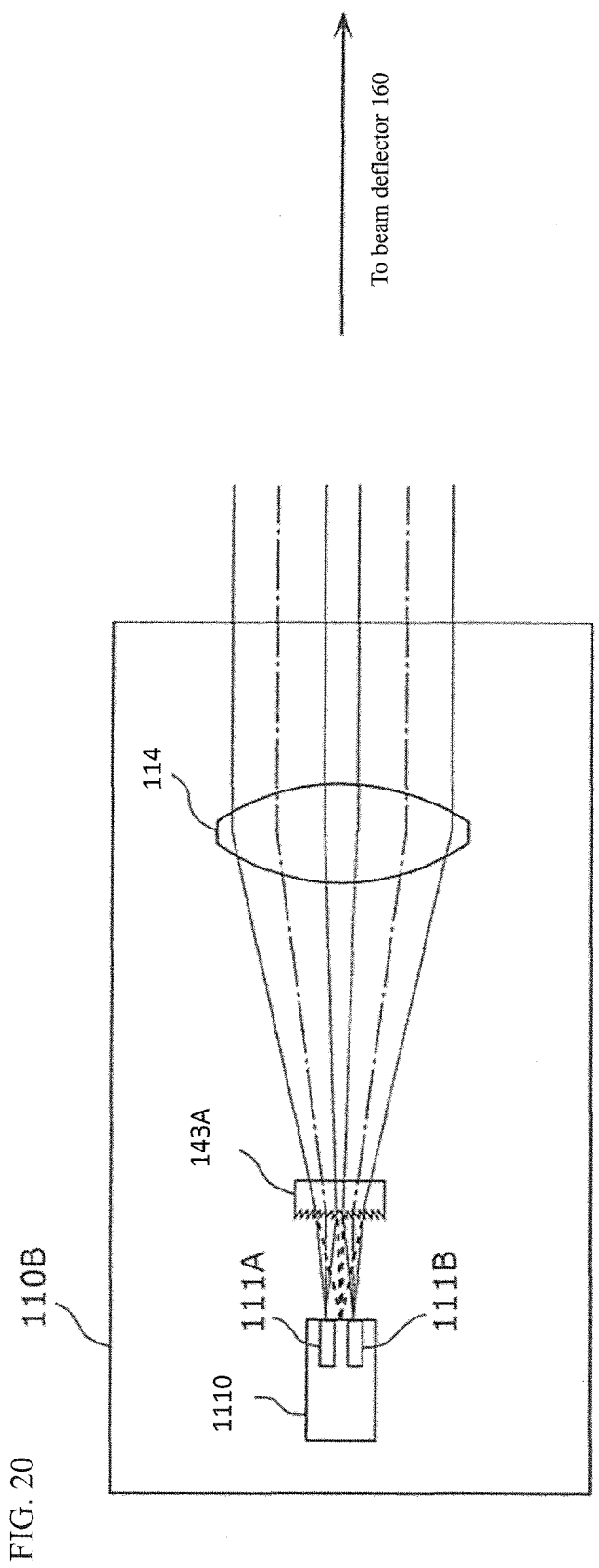
FIG. 20 shows a diagram illustrating an example of a configuration of a laser light source according to one or more embodiments of the invention.

FIG. 20 is a diagram illustrating an example of a configuration of a laser light source according to one or more embodiments of the invention.

A laser light source 110B illustrated in FIG. 20 differs from the laser light source 110A illustrated in FIG. 16 in not having the diffraction grid plate 143 but being added with a diffraction grid plate 143A.

The collimator lens 114 is an example of the first optical element and converts a laser light deflected by the diffraction grid plate 143A into a substantially parallel light.

The diffraction grid plate 143A is an example of the second optical element and deflects the light beam of the laser lights emitted from the two or more emission points. For example, the diffraction grid plate 143A is disposed between the two or more emission points and the first optical element and deflects the laser lights emitted from the two or more emission points in an orientation where emission can be deemed as being from an emission point on the optical axis of the second optical element.

In one or more embodiments of the present example, as illustrated in FIG. 20, the diffraction grid plate 143A is disposed between the laser unit 1110 and the collimator lens 114 and deflects the light beam of the laser light emitted from the emission point 111A or the emission point 111B in a predetermined direction.

Figure 21:
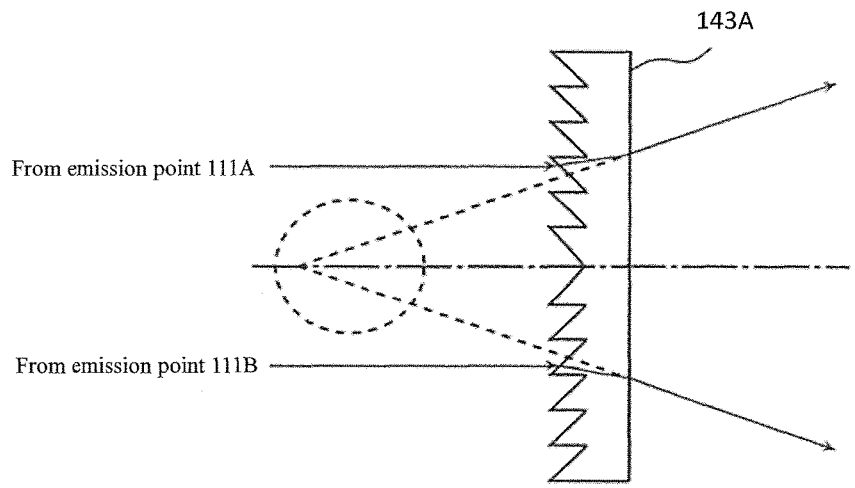
FIG. 21 shows a diagram illustrating an example of a configuration of a diffraction grid plate according to one or more embodiments of the invention.

FIG. 21 is a diagram illustrating an example of a configuration of the diffraction grid plate according to one or more embodiments of the invention.

The diffraction grid plate 143A has two diffraction grid surfaces having the surface where the cross-sectional shape of the grooves is serrated (brazed surface) on the collimator-lens 114 side. Because the two diffraction grid surfaces are similar to those of the diffraction grid plate 143, description thereof here will be omitted.

In one or more embodiments of the present example, by the laser light emitted from the emission point 111A or the emission point 111B being deflected in the predetermined direction by the diffraction grid plate 143A, a virtual image of an emission point of the light beam of the deflected laser light can be aligned. That is, the diffraction grid plate 143A, by deflecting the laser light emitted from the emission point 111A or the emission point 111B in the predetermined direction, renders the laser light as one that can be deemed as the light beam of the laser light being emitted from one emission point (light source of the virtual image) on an optical axis of a diffraction grid plate 143A (and collimator lens 114) such as the one illustrated in the dotted-line circle region in FIG. 21 for example.

<Effects>

According to one or more embodiments of the present example, even if the plurality of emission points emits at time divisions, the laser lights emitted from every emission point can be handled like a laser light emitted from the same emission point. By this, control of the beam deflector 160 and the like can be made simpler.

Example 6

In embodiments of Examples 4 and 5, an image projection apparatus having one laser light source is described, but the invention is not limited thereto. In one or more embodiments of the present example, an image projection apparatus having a plurality of laser light sources will be described.

Figure 22:
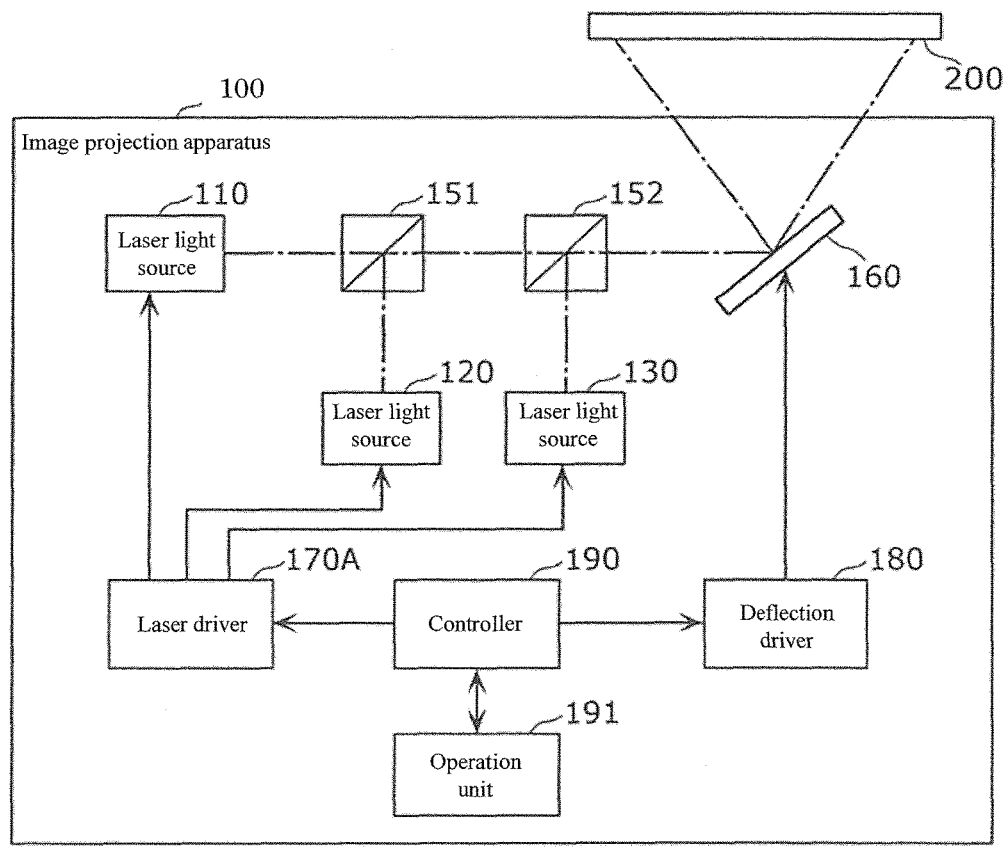
FIG. 22 shows a diagram illustrating an example of a configuration of the image projection apparatus according to one or more embodiments of the invention.
Figure 23:
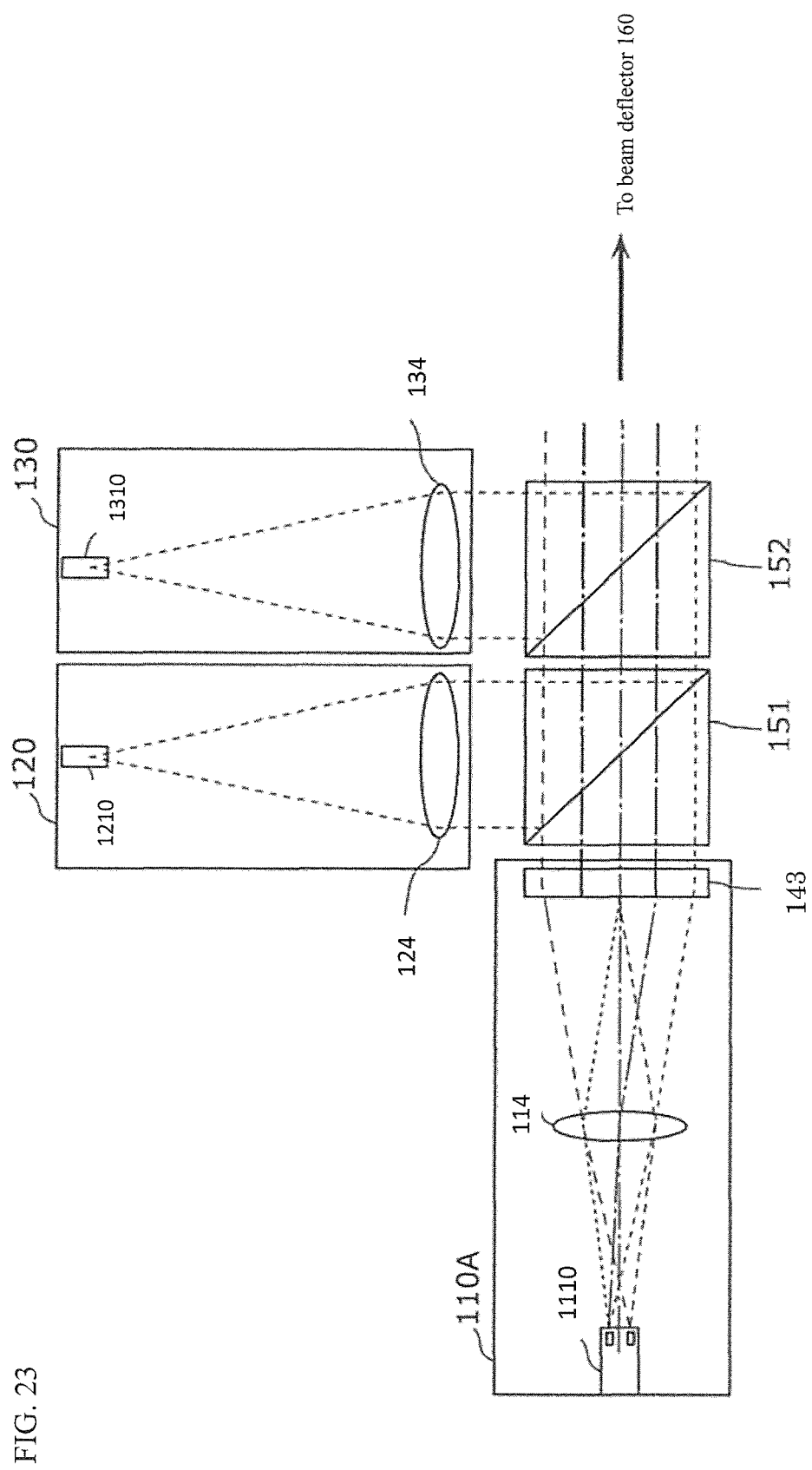
FIG. 23 shows a diagram for describing a configuration of the laser light source according to one or more embodiments of the invention.

FIG. 22 is a diagram illustrating an example of a configuration of the image projection apparatus 100 according to one or more embodiments of the invention. FIG. 23 is a diagram for describing a configuration of the laser light source according to one or more embodiments of the invention. Elements similar to those in FIG. 14 are labeled with the same reference signs, and detailed description thereof will be omitted.

The image projection apparatus 100 illustrated in FIG. 22 differs from the image projection apparatus 100 according to one or more embodiments of the example 4 in that a configuration of the laser light source 120, the laser light source 130, the beam combiner 151, and the beam combiner 152 are added and in that a configuration of a laser driver 170A is different.

As illustrated in FIG. 23, the laser light source 120 comprises a laser unit 1210, which has one emission point, and a collimator lens 124. The laser light source 120 irradiates, for example, a green laser light through the beam combiner 151 to the beam deflector 160.

Similarly, as illustrated in FIG. 23, the laser light source 130 comprises a laser unit 1310, which has one emission point, and a collimator lens 134. The laser light source 130 irradiates, for example, a blue laser light through the beam combiner 152 to the beam deflector 160.

The laser driver 170A supplies a drive current to the laser light source 110, the laser light source 120, and the laser light source 130, respectively. The laser driver 170A selects one of the two or more emission points had by the laser light source 110 at time divisions and supplies a corresponding drive current to the selected one emission point from among the two or more in order to switch the two or more emission points at time divisions and cause the two or more emission points to emit the laser lights at time divisions. Moreover, the laser driver 170A causes the laser light source 120 and the laser light source 130 to continuously emit by supplying drive currents corresponding to the laser light source 120 and the laser light source 130.

<Configuration of Laser Driver>

Figure 24:
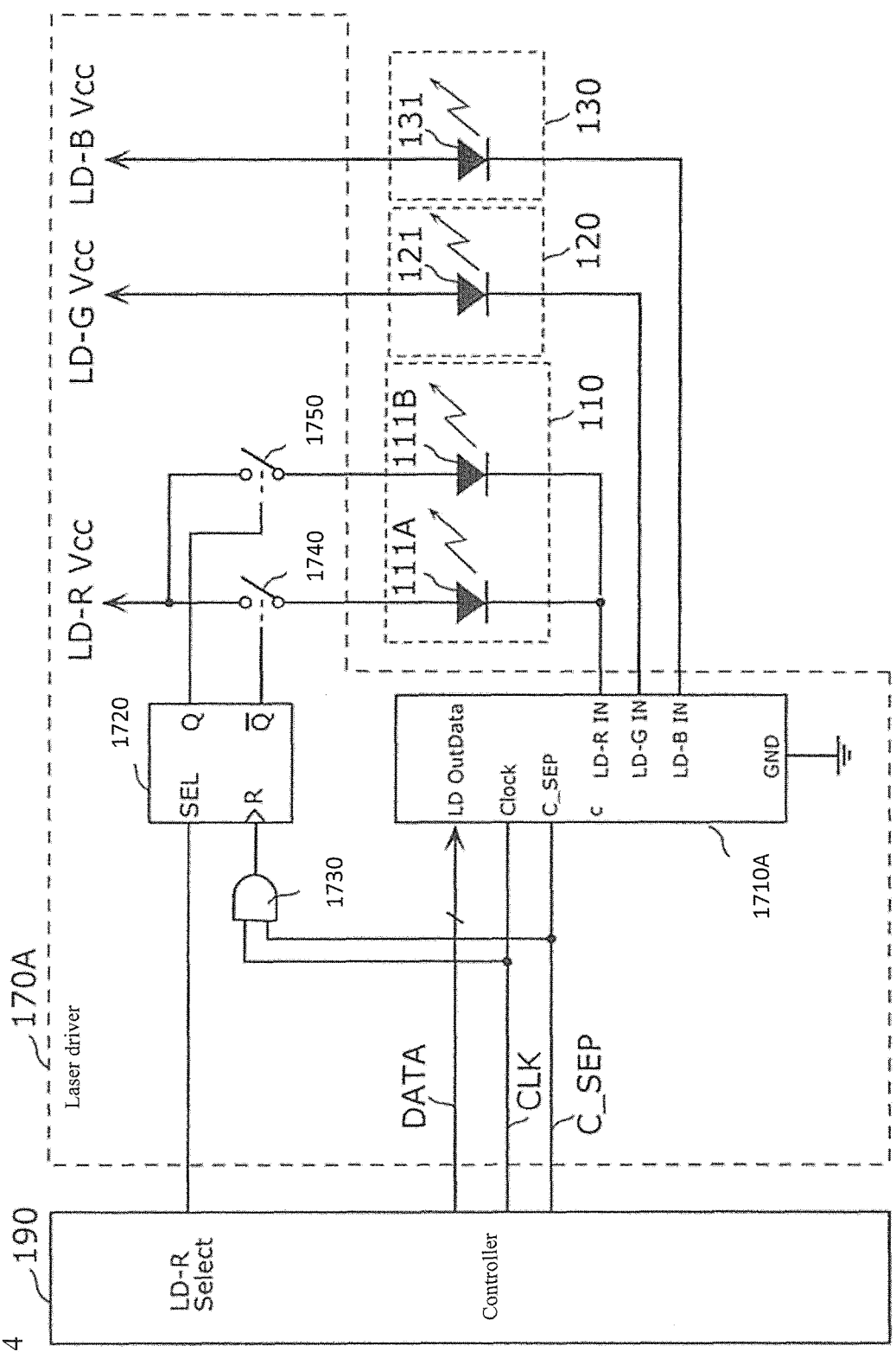
FIG. 24 shows a diagram illustrating an example of a configuration of the laser driver according to the one or more embodiments of the invention.

FIG. 24 is a diagram illustrating an example of a configuration of the laser driver 170A according to one or more embodiments of the invention. Elements similar to those in FIG. 18 are labeled with the same reference signs, and detailed description thereof will be omitted.

As illustrated in FIG. 24, the laser driver 170A comprises a register circuit 1710A, the selection circuit 1720, the AND circuit 1730, the switch 1740, and the switch 1750. In the same diagram, the "DATA" signal indicates the video data signal, and the "CLK" signal indicates a clock signal of the laser driver 170A.

The register circuit 1710A is input in order with video data (brightness values) of red, blue, and green, for example, 8 bits at a time from the controller 190 and converts the input video data (brightness values) of red, blue, and green of 8 bits at a time into the drive current for driving the emission point 111A or the emission point 111B in the laser light source 110, the drive current for driving the laser light source 120, and the drive current for driving the laser light source 130. The register circuit 1710A rewrites the drive currents corresponding to the video data of 8 bits at a time at every operation clock and applies these to the cathode of the emission point 111A or the emission point 111B from the LD-RIN, a cathode of the laser unit 1210 of the laser light source 120 from an LD-GIN, and a cathode of the laser unit 1310 of the laser light source 130 from an LD-BIN. The register circuit 1710A rewrites these drive currents in the state where the C_SEP signal, which is the signal indicating the timing of rewriting, is H and at the timing of the CLK signal (clock signal) rising.

<Operation of Image Projection Apparatus>

Figure 25:
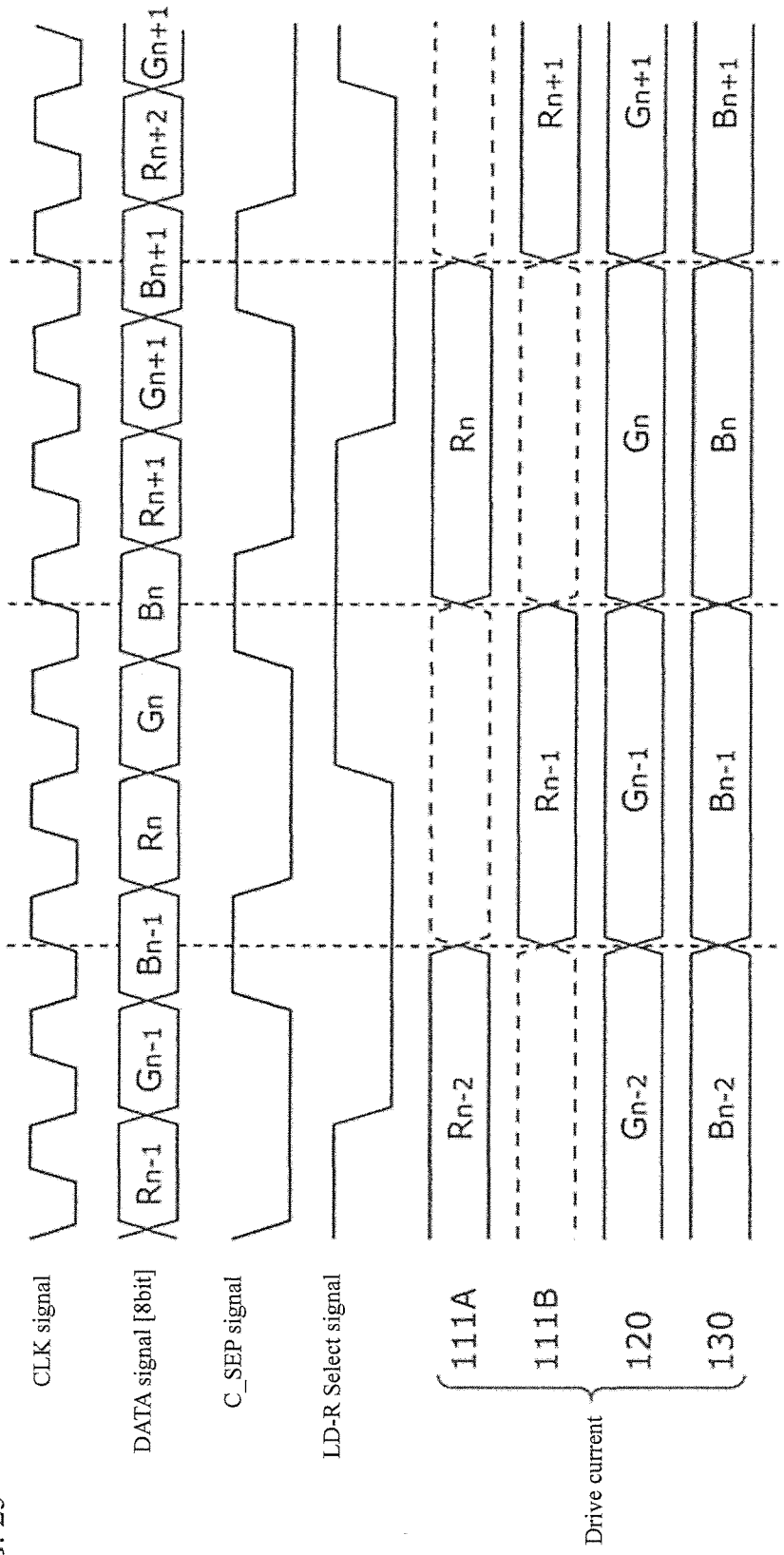
FIG. 25 shows a timing chart illustrating an example of an operation of the image projection apparatus according to one or more embodiments of the invention.

FIG. 25 is a timing chart illustrating an example of an operation of the image projection apparatus 100 according to one or more embodiments of the invention. In the example illustrated in FIG. 25, an example of a situation where the operation clock is a plurality of clocks (three clocks) is illustrated.

A brightness value of each pixel of the video data is sent to the laser driver 170A in synchronization with the clock in an order of red, blue, and green and sequentially written in a register (not illustrated) of the register circuit 1710A. The register circuit 1710A, in the state where the C_SEP signal is H and at the timing of the CLK signal rising, switches to current values (drive currents) that are in accordance with the brightness values written in the register and drive the emission point 111A or the emission point 111B, the laser light source 120, and the laser light source 130. At this time, when the LD-R SELECT signal is H, the emission point 111A is caused to emit, and the emission point 111B is turned off. Conversely, when the LD-R SELECT signal is L, the emission point 111B is caused to emit, and the emission point 111B is turned off, which is the same as one embodiment of the example 4.

By doing so, the plurality of emission points (here, the emission point 111A and the emission point 111B) can be switched at high speed at time divisions according to the period of the C_SEP signal.

By operating the image projection apparatus 100 according to one or more embodiments of the present example in this manner, emission (driving) in the two emission points (emission point 111A and emission point 111B) of the laser light source 110 is continuously in only one emission point. Moreover, by causing one to emit and turning off the other from among the two emission points of the laser light source 110, even if continuous irradiation is performed as the laser light source 110, the other from among the two emission points can be provided with the cooling period from time to time; therefore, the temperature of the laser chip configuring the laser light source 110 can be suppressed from escalating.

The operation clock may be one clock or a plurality of clocks, similar to Example 1. Moreover, the laser driver 170A may switch the two or more emission points at an operation clock count of a number differing at the end portion and the central portion of the image projected to the screen 200, which is also similar to one embodiment of the example 4.

Furthermore, in the above, the situation where the laser light source 120 and the laser light source 130 only have one emission point each is described, but the invention is not limited thereto. The laser light source 120 and the laser light source 130 may, similarly to the laser light source 110, have a plurality of emission points.

<Effects>

In the image projection apparatus 100 according to one or more embodiments of the present example, color unevenness in the projected image can be suppressed from arising even if the laser light is continuously emitted.

For example, according to one or more embodiments of the present example, by causing one emission point to emit and turning off the others in the plurality of emission points configuring the laser light source 110, even if continuous irradiation is performed as the laser light source 110, the cooling period can be provided from time to time to the other emission points. By providing the cooling period from time to time to the other emission points, escalation of the temperature of the laser chip configuring the laser light source 110 can be suppressed; therefore, output fluctuations of the laser light due to temperature escalation of the laser chip can be suppressed, and a stable laser light output can be obtained. By this, color unevenness in the projected image can be suppressed from arising even if the laser light is continuously emitted.

When the emission properties (properties of emission power) of the plurality of emission points configuring the laser light source 110 differ, each of the plurality of emission points do not need to be switched to time divisions consisting of the same time; however, since this is similar to one embodiment of the example 4, description will be omitted.

Furthermore, in one or more embodiments of the present example, the laser light sources 120, 130 that irradiate the green and blue laser lights are described as having a single emission point, but the invention is not limited thereto. These laser light sources 120, 130 may also have a plurality of emission points.

Example 7

Figure 12:
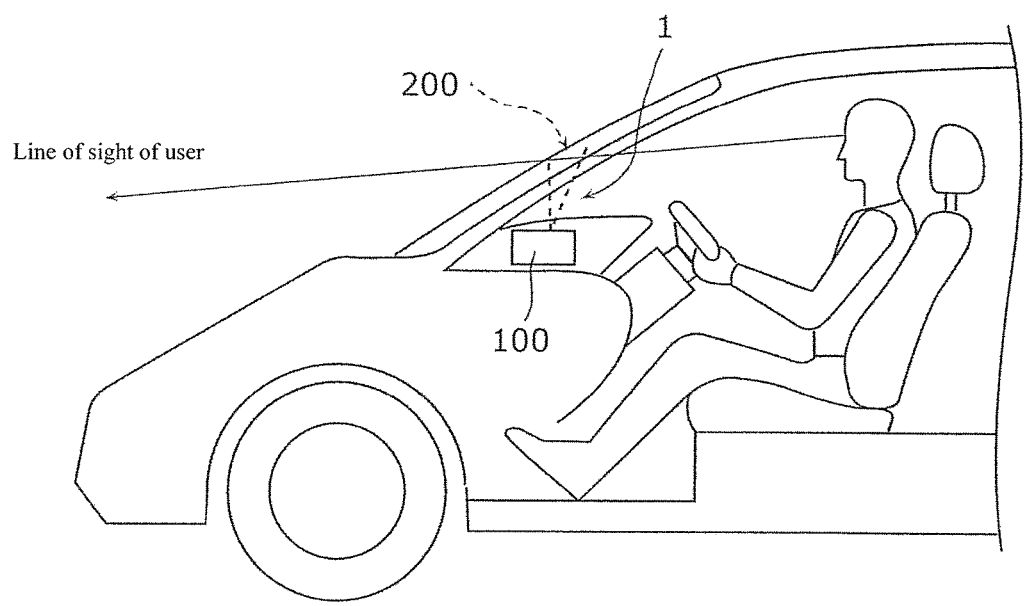
FIG. 12 shows a diagram illustrating a usage example of the image projection apparatus in a car navigation system according to one or more embodiments of the invention.

FIG. 12 is a diagram illustrating an example of an HUD as a usage example of the image projection apparatus according to one or more embodiments of the invention.

As illustrated in FIG. 12, an HUD 1 comprises the image projection apparatus 100 according to an embodiment of the invention described above and the screen 200. The HUD 1 is mounted in, for example, an automobile, and used as a display device of a car navigation system.

The image projection apparatus 100 projects an image including navigation information to the screen 200. The screen 200 reflects the projected image into the field of vision of a driver as a virtual image beyond a windshield (in the scenery outside of the vehicle). The screen 200 used in the HUD is also referred to as a combiner.

As described above, the image projection apparatus 100 excels in stably projecting the image in a wide brightness range; therefore, car navigation information can be displayed to the driver in an image at a brightness suited for the driver to view under any manner of conditions, for example, conditions where an intensity of an external light differs in the extreme from a clear day to the night.

The image display device according to the embodiments of the invention and the HUD as an example of application thereof are described above; however, the invention is not limited to these embodiments. Forms applying various modifications conceived by persons skilled in the art to the embodiments make also part of the present invention, as long as fall within the scope of the invention.

Although the disclosure has been described with respect to only a limited number of embodiments, those skilled in the art, having benefit of this disclosure, will appreciate that various other embodiments may be devised without departing from the scope of the invention. Accordingly, the scope of the invention should be limited only by the attached claims.

INDUSTRIAL APPLICABILITY

The invention can be applied as a projector device in, for example, a head-up display device mounted in an automobile.

REFERENCE SIGNS LIST

1 HUD
100 Image projection apparatus
110, 120, 130, 140, 150 Laser light source
111, 112, 121, 122, 131, 132, 141, 142 Emission point
113, 123, 133 Beam combiner
114, 124, 134 Collimator lens
143 Diffraction grid plate
145 Semiconductor chip
151, 152 Beam combiner
160 Beam deflector
170 Laser driver
171 DAC
172 AND gate
173 Latch
174 to 179 Switch
180 Deflection driver
190 Controller
191 Operation unit
200 Screen

What is claimed is:

1. An image projection apparatus, comprising:
a plurality of laser light sources that each emits laser light;
a first beam combiner that combines the laser lights;
a beam deflector that periodically changes a traveling direction of the combined laser lights and directs the combined laser lights to a screen; and
a controller that controls a drive current supplied to each of the laser light sources based on a relationship between the drive current and a total light intensity outputted from the laser light sources,
wherein the total light intensity comprises a first, a second, and a third range,
wherein the controller supplies the drive current to each of the laser light sources when the combined laser lights are emitted in the total light intensity included in either the first range or the third range, wherein the controller supplies the drive current to at least one or some of the laser light sources when the combined laser lights are emitted in the total light intensity included in the second range,
wherein each of the laser light sources comprises a first emission point that emits a first laser light and a second emission point that emits a second laser light,
wherein the second emission point has an unstable region in a higher current range than the first emission point,
wherein the second range is a combined unstable region of the first and second emission points, and
wherein, within the combined unstable region, current is not supplied to the first emission point while current is supplied to the second emission point.

2. The image projection apparatus of claim 1, wherein each of the laser light sources comprises a laser diode, and the total light intensity included in the first range and the third range is achieved when all of the laser diodes emit lights in any of an LED emission region, a multimode oscillation region, and a single mode oscillation region.

3. The image projection apparatus of claim 1, wherein each of the laser light sources comprises a laser diode, and the total light intensity included in the second range is achieved when any of the laser diodes emits a light in a mode competition region.

4. The image projection apparatus of claim 1, further comprising
a driver that supplies the drive current to each of the laser light sources, wherein the controller
determines the drive current based on the relationship, and
commands the driver to supply the drive current.

5. The image projection apparatus of claim 1, wherein each of the laser light sources comprises:
a second beam combiner that combines the first and second laser lights emitted from the first and second emission points; and
a collimator lens that converts the combined laser lights into substantially parallel lights.

6. The image projection apparatus of claim 1, wherein each of the laser light sources comprises:
a collimator lens that converts the laser lights into substantially parallel lights; and a diffraction grid plate that diffracts the parallel lights in substantially identical traveling directions.

7. The image projection apparatus of claim 1, wherein each of the laser light sources comprises:
   a diffraction grid plate that receives each of the laser lights in different regions, and diffracts the received laser lights in different traveling directions, respectively; and
   a collimator lens that converts the diffracted laser lights into substantially parallel lights, wherein
   the diffraction grid plate diffracts the received laser lights so that each of the laser lights emitted from each of the laser light sources is deemed as being emitted from one point on an optical axis of the collimator lens.

8. The image projection apparatus of claim 1, wherein the laser light sources emit laser lights having different colors, respectively,
   the first beam combiner combines the laser lights having different colors, and
   the controller supplies the drive current for each of the laser lights having different colors based on the relationship.

9. The image projection apparatus of claim 1, wherein the first and second emission points emit the first and second laser lights having substantially identical wavelengths, and
   the controller supplies the drive current to the first and second emission points so that the first and second emission points emit laser lights sequentially at predetermined intervals.

10. The image projection apparatus of claim 9, wherein the controller supplies the drive current to the first and second emission points so that each of the first and second emission points alternately emits a laser light.

11. The image projection apparatus of claim 9, wherein the controller supplies the drive current to the first and second emission points sequentially at a duty rate that allows the each of the laser light sources to emit a laser light in a constant light intensity.

12. The image projection apparatus of claim 9, further comprising
   a driver that supplies the drive current to the first and second emission points, wherein
   the controller directs the driver to supply the drive current to one of the first and second emission points of each of the laser light sources, selected at predetermined intervals.

13. The image projection apparatus of claim 12, wherein the driver supplies the drive current to one of the first and second emission points sequentially selected depending on a pixel clock that has a frequency at which each pixel of an image projected on the screen is updated.

14. The image projection apparatus of claim 12, wherein the driver supplies the drive current to one of the first and second emission points sequentially selected depending on an operation clock of the driver.

15. The image projection apparatus of claim 12, wherein the driver supplies the drive current to one of the first and second emission points sequentially selected depending on a plurality of operation clocks of the laser driver.

16. The image projection apparatus of claim 15, wherein the operation clocks are data clock signals that cause the driver to fetch data.

17. The image projection apparatus of claim 12, wherein the driver supplies the drive current to one of the first and second emission points sequentially selected depending on operation clocks that are different between an end portion and a central portion of the screen.

18. The image projection apparatus of claim 1, wherein the laser light sources comprises a first and a second laser light source, and
   the first and the second laser light source have properties that meet the following condition:

$$Pb1 + Pb2 >= \text{Min}(Pa1, Pa2)$$

where
   $Pa1$ is an upper limit of light intensities included in the second range on the first laser light source,
   $Pb1$ is a lower limit of light intensities included in the second range on the first laser light source,
   $Pa2$ is an upper limit of light intensities included in the second range on the second laser light source, and
   $Pb2$ is a lower limit of light intensities included in the second range on the second laser light source.

19. A head-up display device, comprising:
   an image projection apparatus; and
   a screen, wherein
   the image projection apparatus comprises:
      a plurality of laser light sources that each emits laser light;
      a first beam combiner that combines the laser lights;
      a beam deflector that periodically changes a traveling direction of the combined laser lights and directs the combined laser lights to a screen; and
      a controller that controls a drive current supplied to each of the laser light sources based on a relationship between the drive current and a total light intensity outputted from the laser light sources,
   wherein the total light intensity comprises a first, a second, and a third range,
   wherein the controller supplies the drive current to each of the laser light sources when the combined laser lights are emitted in the total light intensity included in either the first range or the third range,
   wherein the controller supplies the drive current to at least one or some of the laser light sources when the combined laser lights are emitted in the total light intensity included in the second range,
   wherein each of the laser light sources comprises a first emission point that emits a first laser light and a second emission point that emits a second laser light,
   wherein the second emission point has an unstable region in a higher current range than the first emission point,
   wherein the second range is a combined unstable region of the first and second emission points, and
   wherein, within the combined unstable region, current is not supplied to the first emission point while current is supplied to the second emission point.

20. An image projection method, comprising:
   emitting laser lights from a plurality of laser light sources;
   combining the laser lights;
   periodically changing a traveling direction of the combined laser lights and directing the combined laser lights to a screen; and
   controlling a drive current supplied to each of the laser light sources based on a relationship between the drive current and a total light intensity outputted from the laser light sources,
   wherein the total light intensity comprises a first, a second, and a third range,
   wherein the controlling comprises supplying the drive current to each of the laser light sources when the combined laser lights are emitted in the total light intensity included in either the first range or the third range, and supplying the drive current to at least one or some of the laser light sources when the combined laser lights are emitted in the total light intensity included in the second range, wherein each of the laser light sources comprises a first emission point that emits a first laser light and a second emission point that emits a second laser light, wherein the second emission point has an unstable region in a higher current range than the first emission point, wherein the second range is a combined unstable region of the first and second emission points, and wherein, within the combined unstable region, current is not supplied to the first emission point while current is supplied to the second emission point.

\* \* \* \* \*